(12) United States Patent
Madan et al.

(10) Patent No.: US 9,362,882 B1
(45) Date of Patent: Jun. 7, 2016

(54) APPARATUS AND METHODS FOR SEGMENTED VARIABLE CAPACITOR ARRAYS

(71) Applicant: TDK Corporation, Minato-Ku (JP)

(72) Inventors: Anuj Madan, Cambridge, MA (US); Joseph H. Colles, Bonsall, CA (US)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/604,416

(22) Filed: Jan. 23, 2015

(51) Int. Cl.
H03H 7/01 (2006.01)
H01L 49/02 (2006.01)
H03H 1/00 (2006.01)

(52) U.S. Cl.
CPC ............. *H03H 7/0153* (2013.01); *H01L 28/40* (2013.01); *H03H 7/0161* (2013.01); *H03H 2001/0014* (2013.01); *H03H 2001/0064* (2013.01)

(58) Field of Classification Search
CPC ..... H03H 7/01; H03H 7/0138; H03H 7/0153; H03H 2001/0064; H03H 7/0161; H01G 7/00; H01L 28/40
USPC ..................... 333/174, 175; 361/277; 257/401
See application file for complete search history.

(56) References Cited

U.S. PATENT DOCUMENTS

| | | | |
|---|---|---|---|
| 4,878,151 A | 10/1989 | Gallichio | |
| 5,208,597 A | 5/1993 | Early et al. | |
| 5,321,597 A * | 6/1994 | Alacoque | H02M 3/33584 363/124 |
| 5,452,178 A | 9/1995 | Emesh et al. | |
| 6,211,745 B1 | 4/2001 | Mucke et al. | |
| 6,222,221 B1 | 4/2001 | Hou et al. | |
| 6,351,020 B1 | 2/2002 | Tarabbia et al. | |
| 6,377,075 B1 | 4/2002 | Wong | |
| 6,410,954 B1 | 6/2002 | Sowlati et al. | |

(Continued)

FOREIGN PATENT DOCUMENTS

| | | |
|---|---|---|
| EP | 0581702 | 2/1994 |
| JP | S63 308366 | 12/1988 |

(Continued)

OTHER PUBLICATIONS

Sauerbrey J., et al., "A 0.7-V MOSFET-Only Switched-OPAMP Sigmadelta Modulator in Standard Digital CMOS Technology", IEEE Journal of Solid-State Circuits, vol. 37, No. 12, Dec. 2002, pp. 1662-1669.

(Continued)

*Primary Examiner* — Benny Lee
*Assistant Examiner* — Rakesh Patel
(74) *Attorney, Agent, or Firm* — Nixon Peabody LLP

(57) ABSTRACT

Apparatus and methods for segmented variable capacitor arrays are provided herein. In certain configurations, a segmented variable capacitor array includes a plurality of variable capacitor cells that are segmented into most significant bit (MSB) cells and least significant bit (LSB) cells, which are electrically connected in parallel between a radio frequency (RF) input and an RF output of the array. The segmented variable capacitor array further includes an MSB decoder for generating MSB control signals for controlling the capacitance of the MSB cells based on a first portion of a control signal's bits, and an LSB decoder for generating LSB control signals for controlling the capacitance of the LSB cells based on a second portion of the control signal's bits. The segmented variable capacitor array is segmented such that each of the MSB cells has a greater nominal capacitance than each of the LSB cells.

25 Claims, 14 Drawing Sheets

(56) References Cited

U.S. PATENT DOCUMENTS

| | | |
|---|---|---|
| 6,657,509 B1 | 12/2003 | Ohannes |
| 6,674,321 B1 | 1/2004 | York |
| 6,765,778 B1 | 7/2004 | Du et al. |
| 6,885,081 B2 | 4/2005 | Morimoto |
| 7,000,000 B1 | 2/2006 | O'Brien |
| 7,245,519 B2 | 7/2007 | McQuirk et al. |
| 7,251,121 B2 | 7/2007 | Bhutta |
| 7,280,001 B2 | 10/2007 | Maligeorgos et al. |
| 7,408,422 B2 | 8/2008 | Dedieu et al. |
| 7,453,136 B2 | 11/2008 | Hakkarainen |
| 7,528,667 B1 * | 5/2009 | Tan ............ H03J 1/0008 331/177 V |
| 7,920,030 B2 | 4/2011 | Jang et al. |
| 8,134,222 B2 | 3/2012 | Khan et al. |
| 8,324,069 B1 | 12/2012 | Carns et al. |
| 8,395,880 B2 | 3/2013 | Wasson |
| 8,531,862 B2 | 9/2013 | Roest et al. |
| 9,019,007 B2 | 4/2015 | Gupta et al. |
| 9,086,709 B2 | 7/2015 | Gupta et al. |
| 9,110,483 B2 | 8/2015 | Madan et al. |
| 9,201,442 B2 | 12/2015 | Gupta et al. |
| 2002/0140115 A1 | 10/2002 | Inoh et al. |
| 2004/0066244 A1 | 4/2004 | Takinami et al. |
| 2005/0030116 A1 | 2/2005 | Takagi |
| 2005/0184812 A1 | 8/2005 | Cho |
| 2006/0006431 A1 | 1/2006 | Jean et al. |
| 2006/0043499 A1 * | 3/2006 | De Cremoux ..... H03K 17/6874 257/401 |
| 2006/0125121 A1 | 6/2006 | Ko et al. |
| 2008/0048236 A1 | 2/2008 | Kim |
| 2008/0197923 A1 | 8/2008 | Nakajima et al. |
| 2008/0265977 A1 | 10/2008 | Gu |
| 2009/0096507 A1 | 4/2009 | Gao et al. |
| 2009/0128992 A1 | 5/2009 | Haralabidis |
| 2009/0160263 A1 | 6/2009 | Spears et al. |
| 2009/0243743 A1 | 10/2009 | Kossel et al. |
| 2009/0325521 A1 | 12/2009 | Dubash et al. |
| 2010/0052778 A1 | 3/2010 | Baranauskas |
| 2010/0079167 A1 | 4/2010 | Thomsen |
| 2010/0134182 A1 | 6/2010 | Kapoor et al. |
| 2011/0002080 A1 | 1/2011 | Ranta |
| 2011/0109380 A1 | 5/2011 | Park et al. |
| 2011/0121910 A1 | 5/2011 | Yang et al. |
| 2011/0298526 A1 | 12/2011 | Homol et al. |
| 2011/0316062 A1 | 12/2011 | Kondo et al. |
| 2012/0211868 A1 | 8/2012 | Stribley et al. |
| 2012/0213015 A1 | 8/2012 | Romanovskyy et al. |
| 2014/0009211 A1 | 1/2014 | Madan et al. |
| 2014/0062575 A1 | 3/2014 | Hurwitz |
| 2014/0354348 A1 | 12/2014 | Gupta et al. |
| 2014/0355172 A1 | 12/2014 | Gupta et al. |
| 2014/0367831 A1 | 12/2014 | Yen et al. |

FOREIGN PATENT DOCUMENTS

| | | |
|---|---|---|
| JP | 2006128468 | 5/2006 |
| WO | WO 2013-028546 A1 | 2/2013 |

OTHER PUBLICATIONS

Ming-Jer Chen et al: "A Novel Cross-Coupled Inter-Poly-Oxide Capacitor for Mixed-Mode CMOS Processes", IEEE Electron Device Letters, vol. 20, No. 7, Jul. 1999 (3 pages).

Han Q et al: "Perturbation Analysis and Experimental Verification of Intermodulation and Harmonic Distortion for an Anti-Series Varactor Pair", IEICE Transactions on Electronics, vol. E88-C, No. 1, Jan. 2005, pp. 89-97.

Pietro Andreani et al: "On the Use of MOS Varactors in RF VCO's", IEEE Journal of Solid-State Circuits, vol. 35, No. 6, Jun. 2000 (6 pages).

Kampe, A et al., "An LC-VCO with one octave tuning range," IEEE European Conference on Circuit Theory and Design, vol. 3, Aug. 29, 2005, pp. 321-324.

Nakamura, T et al., "A Low-Phase-Noise Low-Power 27-GHz SiGe-VCO using Merged-Transformer Matching Circuit Technique," IEEE Radio Frequency Integrated Circuits Symposium, Jun. 2007, pp. 413-416.

Zhiqiang et al., "A Multi-Band RF CMOS LC Bandpass Filter with Continuous Frequency Tuning Design." 2010 International Conference on Computer Application and System Modeling (ICCASM 2010). 4 pages.

* cited by examiner

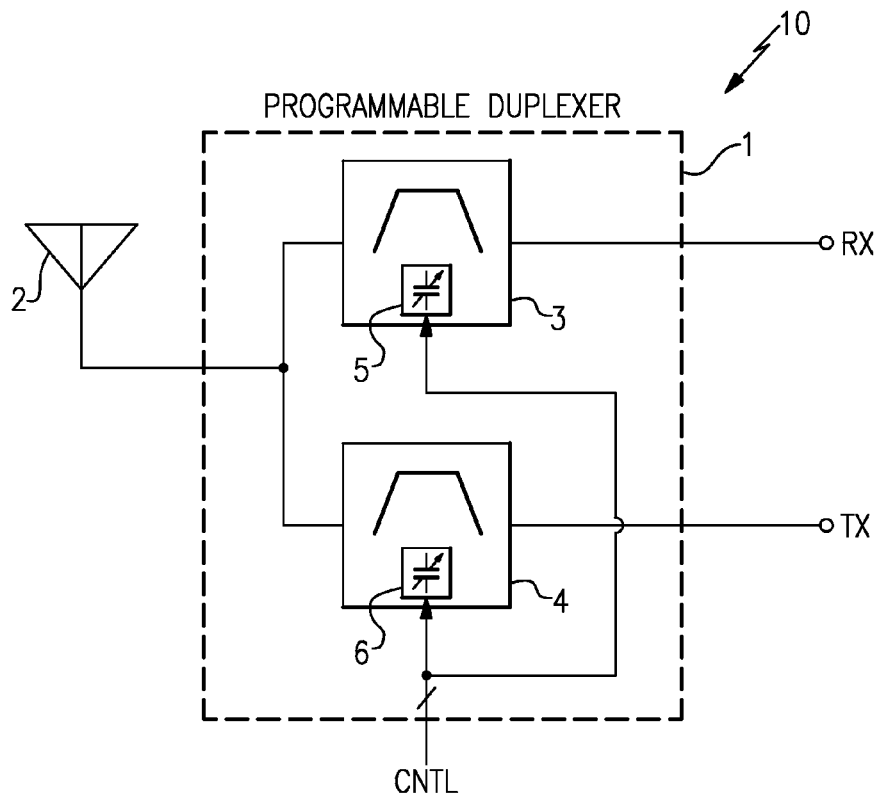
FIG.1A
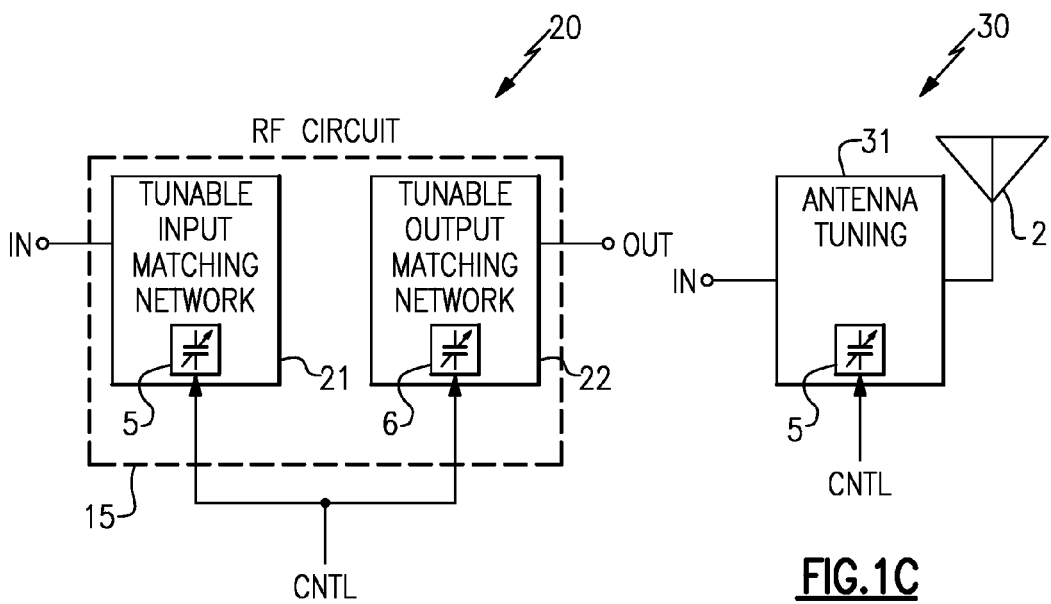
FIG.1B
FIG.1C

APPARATUS AND METHODS FOR SEGMENTED VARIABLE CAPACITOR ARRAYS

BACKGROUND

1. Field

Embodiments of the invention relate to electronic systems and, in particular, to variable capacitors for radio frequency (RF) circuits.

2. Description of the Related Technology

A capacitor can include a pair of conductors separated by a dielectric. When a voltage is applied between the pair of conductors, an electric field can develop across the dielectric, which can lead to a store of charge in the capacitor. The capacitance of a capacitor corresponds to a ratio of the charge stored to a voltage difference between the conductors. Other parameters, such as quality factor (Q-factor), frequency response, and/or linearity, can also be important in selecting a capacitor that is appropriate for a particular application.

Capacitors can be used in a variety of types of analog and radio frequency (RF) circuits. For example, capacitors can be included in filters, duplexers, resonators, tuners, and/or other circuitry.

SUMMARY

In one aspect, an integrated circuit includes a segmented variable capacitor array configured to receive a multi-bit digital control signal. The segmented variable capacitor array includes a radio frequency (RF) input and an RF output, a plurality of most significant bit (MSB) variable capacitor cells electrically connected in parallel between the RF input and the RF output, and a plurality of least significant bit (LSB) variable capacitor cells electrically connected in parallel between the RF input and the RF output. Each of the plurality of MSB variable capacitor cells has a nominal capacitance that is greater than a nominal capacitance of each of the plurality of LSB variable capacitor cells. The segmented variable capacitor array further includes an MSB decoder configured to receive a first portion of bits of the multi-bit digital control signal and to generate a plurality of MSB control signals and an LSB decoder configured to receive a second portion of bits of the multi-bit digital control signal and to generate a plurality of LSB control signals. The plurality of MSB control signals are configured to control a capacitance of the plurality of MSB variable capacitor cells, and the plurality of LSB control signals are configured to control a capacitance of the plurality of LSB variable capacitor cells.

In another aspect, a method of controlling a variable capacitance between an RF input and an RF output is provided. The method includes receiving a multi-bit digital control signal, generating a plurality of MSB control signals by decoding a first portion of bits of the multi-bit digital control signal using an MSB decoder, biasing a plurality of MSB variable capacitor cells using the plurality of MSB control signals, generating a plurality of LSB control signals by decoding a second portion of bits of the multi-bit digital control signal using an LSB decoder, and biasing a plurality of LSB variable capacitor cells using the plurality of LSB control signals. Each of the plurality of MSB variable capacitor cells is electrically connected in parallel between the RF input and the RF output, and each of the plurality of LSB variable capacitor cells is electrically connected in parallel between the RF input and the RF output. Each of the plurality of MSB variable capacitor cells has a nominal capacitance that is greater than a nominal capacitance of each of the LSB variable capacitor cells.

In another aspect, an apparatus is provided. The apparatus includes an RF input, an RF output, and a first plurality of variable capacitor cells electrically connected in parallel between the RF input and the RF output, wherein each of the first plurality of variable capacitor cells has about the same nominal capacitance as one another. The apparatus further includes a thermometer decoder configured to receive a first plurality of control bits and to generate a first plurality of control signals, which are configured to control a capacitance of the first plurality of variable capacitor cells.

BRIEF DESCRIPTION OF THE DRAWINGS

FIG. 1A is a schematic diagram of one embodiment of a radio frequency (RF) system.

FIG. 1B is a schematic diagram of another embodiment of an RF system.

FIG. 1C is a schematic diagram of another embodiment of an RF system.

DETAILED DESCRIPTION OF EMBODIMENTS

Figure 2:
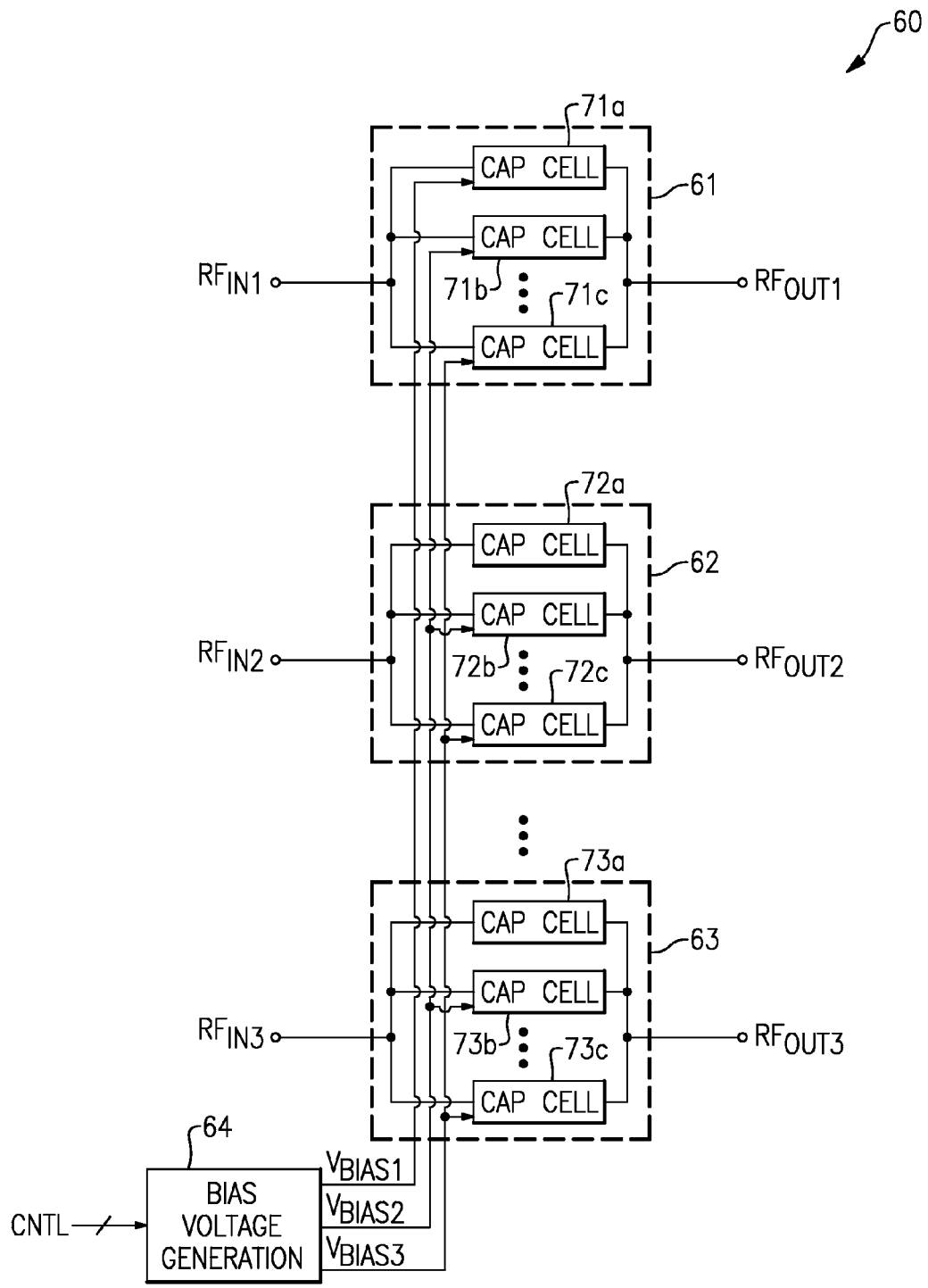
FIG. 2 is a schematic diagram of an integrated circuit (IC) according to one embodiment.

The following detailed description of certain embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Apparatus and methods for segmented variable capacitor arrays are provided herein. In certain configurations, a segmented variable capacitor array includes a plurality of variable capacitor cells that are segmented into primary or most significant bit (MSB) cells and secondary or least significant bit (LSB) cells. The MSB and LSB cells are electrically connected in parallel between a radio frequency (RF) input and an RF output of the array, and the segmented variable capacitor array receives a multi-bit digital control signal for controlling the array's capacitance. The segmented variable capacitor array further includes an MSB decoder for generating MSB control signals for controlling the capacitance of the MSB cells based on a first portion of the control signal's bits, and an LSB decoder for generating LSB control signals for controlling the capacitance of the LSB cells based on a second portion of the control signal's bits. The segmented variable capacitor array is segmented such that each of the MSB cells has a greater nominal capacitance than each of the LSB cells.

An overall capacitance of the array can be controlled by selectively controlling the capacitance of the MSB and LSB cells using the multi-bit digital control signal. In certain configurations, the MSB cells have substantially the same nominal capacitance as one another, and the LSB cells can be scaled in size relative to one another such that the LSB cells have different nominal capacitances as one another. For example, in one embodiment, the MSB decoder comprises a thermometer decoder that selects an active number of MSB cells of about the same nominal capacitance, and the LSB decoder comprises a binary decoder that selects an active number of binary-weighted LSB cells.

As used herein, comparisons of a nominal capacitance of a first variable capacitor cell to a nominal capacitance of a second variable capacitor refers to comparisons of the nominal capacitances of the first and second variable capacitor cells for the same value of a control or bias signal, such as a voltage level of a control signal associated with a high capacitance setting of the variable capacitor cells. Additionally, as used herein, the nominal capacitance of two capacitor cells can be about the same when the nominal capacitances of the capacitor cells at the same value of the control signal are within 5% of one another, or more particularly, within 1% of one another.

Segmenting a variable capacitor array into multiple sections of cells controlled by different decoders can improve the array's performance. For example, the segmented variable capacitor arrays herein can have a shorter switching time associated with changing a capacitance setting of the array from one value to another. For instance, segmenting a variable capacitor array can reduce an overall length of conductors used to carry control signals to the array's cells and/or reduce a capacitive load on circuitry used to generate the control signals. In contrast, a binary-weighted variable capacitor array can have a relatively large capacitive load and/or long conductor lengths for certain control signals, such as a control signal for a most significant bit. Thus, a segmented variable capacitor array can have smaller resistor-capacitor (RC) time constants associated with switching control signals from one value to another, and can exhibit faster switching time relative to non-segmented variable capacitor arrays.

Decreasing a decoder's capacitive load can also aid in enhancing performance in configurations in which the MSB and/or LSB control signals are controlled to voltage levels generated by analog circuitry. For example, in certain configurations, analog circuitry, such as charge pumps and/or voltage regulators, generates bias voltage levels to which the MSB and LSB control signals are selectively controlled to set the overall capacitance of the array. Since segmentation can provide control lines that have reduced and/or balanced capacitive loading, the analog circuitry can operate with enhanced performance and/or relaxed design constraints, which in turn can result in the analog circuitry being implemented with lower power consumption, reduced complexity, and/or smaller size.

The segmented variable capacitor arrays can also provide a fine and/or balanced step-size, which can provide enhanced control over the array's capacitance. Accordingly, the segmented variable capacitor arrays herein can be calibrated with higher precision. Additionally, an electronic circuit that includes one or more segmented variable capacitor arrays can operate with improved performance. For instance, the segmented variable capacitor arrays described herein can be included in tunable RF circuitry, such as programmable duplexers, filters, matching networks, and/or tuners, and the segmented variable capacitor array can be used to provide fine-tuned control over the tunable RF circuitry's frequency characteristics.

In certain configurations, the segmented capacitor array can have a layout that is centroided to reduce an impact of process variation on a capacitance value of the array at a particular setting. Thus, the segmented variable capacitor array can exhibit enhanced performance, such as superior linearity. Additionally, centroided segmented variable capacitor arrays can exhibit less part-to-part variation, which can improve yield by increasing a percentage of parts that meet or exceed target performance specifications.

In certain configurations, the cells of a segmented variable capacitor array are implemented using metal oxide semiconductor (MOS) capacitors, and the MSB control signals and LSB control signals are used to bias the MOS capacitors to control an overall capacitance of the array. In one embodiment, the MSB and LSB cells of a segmented variable capacitor array include one or more pairs of MOS capacitors implemented in anti-parallel and/or anti-series configurations. Additionally, the MSB and LSB control signals generated by the MSB and LSB decoders can bias the MOS capacitors of a particular cell to either a first voltage level or a second voltage level associated with high linearity. In certain implementations, the first bias voltage level is associated with an accumulation mode of the MOS capacitors and the second bias voltage level is associated an inversion mode of the MOS capacitors.

As used herein and as persons having ordinary skill in the art will appreciate, the terms MOS capacitors refer to any types of capacitors made from transistors with insulated gates. These MOS capacitors can have gates made from metals, such as aluminum, and dielectric regions made out of silicon oxide. However, these MOS capacitors can alternatively have gates made out of materials that are not metals, such as poly silicon, and can have dielectric regions implemented not just with silicon oxide, but with other dielectrics, such as high-k dielectrics. In certain embodiments, the MOS capacitors are fabricated using silicon on insulator (SOI) processes. For example, an integrated circuit can include a support substrate, a buried oxide (BOX) layer over the support substrate, and a device layer over the BOX layer, and the MOS capacitors can be fabricated in the device layer.

In certain configurations, a segmented variable capacitor array omits any switches in the signal path between the segmented variable capacitor array's RF input and RF output.

Switches can introduce insertion loss, degrade Q-factor, and/or decrease linearity. Thus, rather than providing capacitance tuning by opening and closing switches to set a number of active capacitance cells, capacitance tuning can be provided by biasing MOS capacitors of the variable capacitor cells at different bias voltage levels to provide a desired overall capacitance of the segmented variable capacitor array. For example, a particular MSB or LSB control signal can be selectively set to either a first bias voltage level or a second bias voltage level to control the array's overall capacitance. Omitting switches in the signal path between the segmented variable capacitor array's RF input and RF output can aid in providing an array with a relatively small size, a relatively high Q-factor, a relatively high linearity, and/or a relatively low insertion loss.

In another embodiment, an apparatus including an RF input, an RF output, a first plurality of variable capacitor cells and a thermometer decoder is provided. The variable capacitor cells are electrically connected in parallel between the RF input and the RF output, and have about the same nominal capacitance as one another. The thermometer decoder generates a first plurality of control signals for controlling a capacitance of the variable capacitor cells based on a first plurality of control bits. In certain configurations, the variable capacitor cells are implemented with a layout that is centroided. In certain implementations, the variable capacitor cells can include pairs of MOS capacitors connected in anti-series and/or anti-parallel. When additional capacitive tuning is desired between the RF input and RF output, the apparatus can further include a second plurality of variable capacitor cells and an additional decoder. The second plurality of variable capacitor cells are electrically connected in parallel between the RF input and RF output, and each of the first plurality of variable capacitor cells has a nominal capacitance that is greater than a nominal capacitance of each of the second plurality of variable capacitor cells. In certain configurations, the second plurality of variable capacitor cells are implemented with binary-weighting and the additional decoder comprises a binary decoder.

FIG. 1A is a schematic diagram of one embodiment of a radio frequency (RF) system 10. The RF system 10 includes a programmable duplexer 1, an antenna 2, a receive terminal RX, and a transmit terminal TX. The RF system 10 can represent a portion of a wireless device, such as a smart phone. Accordingly, although not illustrated in FIG. 1A for clarity, the RF system 10 can include additional components and/or circuitry.

As shown in FIG. 1A, the programmable duplexer 1 includes a first programmable filter 3 and a second programmable filter 4. The first programmable filter 3 includes an input electrically connected to the antenna 2 and an output electrically connected to the receive terminal RX. The first programmable filter 3 further includes a first segmented variable capacitor array 5, which can be used to control a filtering characteristic of the first programmable filter 3, such as the location in frequency of a passband. The second programmable filter 4 includes an input electrically connected to the transmit terminal TX and an output electrically connected to the antenna 2. The second programmable filter 4 further includes a second segmented variable capacitor array 6, which can be used to control a filtering characteristic of the second programmable filter 4.

A wireless device such as a smart phone, tablet, or laptop computer can communicate over multiple frequency bands using one or more common or shared antennas. A desire to transmit at wider bandwidth and/or over different communications networks has increased a demand for the number of bands that a wireless device can communicate over. For example, a wireless device may be specified to operate using one or more of a variety of communications standards including, for example, GSM/EDGE, IMT-2000 (3G), 4G, Long Term Evolution (LTE), Advanced LTE, IEEE 802.11 (Wi-Fi), Mobile WiMAX, Near Field Communication (NFC), Global Positioning System (GPS), GLONASS, Galileo, Bluetooth, and the like. Proprietary standards can also be applicable. The complexities of multi-band communication can be further exacerbated in configurations in which the wireless device is specified to use carrier aggregation.

Certain conventional wireless devices can include a multi-throw switch and a duplexer associated with each of the frequency bands, and the multi-throw switch can be used to selectively couple an antenna to a duplexer associated with a particular band. The duplexers can provide band filtering using, for example, passive filtering structures, such as a surface acoustic wave (SAW) filters and/or thin film bulk acoustic resonators (FBARs). The multi-throw switch can be used to electrically couple the antenna to a duplexer associated with a frequency band that the wireless device is transmitting and/or receiving over at a particular time instance.

In the illustrated configuration, the programmable duplexer 1 can be configured to filter a particular frequency band by programming the first and second programmable filters 3, 4 using a control signal CNTL. For example, in certain embodiments, the capacitance value of the first segmented variable capacitor array 5 can be controlled using the control signal CNTL to control a frequency location of a passband of the first programmable filter 3, and the capacitance value of the second segmented variable capacitor array 6 can be controlled using the control signal CNTL to control a frequency location of a passband of the second programmable filter 4.

Accordingly, the programmable duplexer 1 can be used to provide the RF system 10 with multi-band capability, while avoiding a need for using a multi-throw switch and a duplexer for each frequency band. Including the programmable duplexer 1 in the RF system 10 can reduce insertion loss in transmit and/or receive paths by eliminating a need for a multi-throw switch. Furthermore, the programmable duplexer 1 can have smaller area relative to a configuration including a multi-throw switch and multiple duplexers. Thus, a wireless device that includes the programmable duplexer 1 can have a smaller form factor and/or lower cost.

In the illustrated configuration, the capacitance values of the first and second segmented variable capacitor arrays 5, 6 can be controlled using the control signal CNTL. In one embodiment, the control signal CNTL is received by the programmable duplexer 1 over an interface, such as a serial peripheral interface (SPI) or Mobile Industry Processor Interface radio frequency front end (MIPI RFFE) interface. Although two examples of interfaces have been provided, other interfaces can be used. Although FIG. 1A illustrates the first and second segmented variable capacitor arrays 5, 6 as receiving a common control signal CNTL, other configurations are possible, such as implementations in which the first and second segmented variable capacitor arrays 5, 6 are controlled using separate control signals.

The first segmented variable capacitor array 5 and/or the second variable capacitor structure 6 can be implemented using one or more embodiments of segmented variable capacitor arrays described herein. In certain configurations, the first and second segmented variable capacitor arrays 5, 6 can include metal oxide semiconductor (MOS) capacitors, which can offer enhanced performance over certain other tunable capacitance structures. For instance, certain microelectromechanical systems (MEMS) capacitors can exhibit low Q-factor, poor reliability, and/or limited tuning range. Additionally, other approaches such as coupled resonators can suffer from large size and/or cost, and thus can be unsuitable for certain applications, including smart phones.

FIG. 1B is a schematic diagram of another embodiment of an RF system 20 that includes an RF circuit 15. The RF circuit 15 includes a tunable input matching network 21 electrically connected to an RF input IN and a tunable output matching network 22 electrically connected to an RF output OUT. As shown in FIG. 1B, the tunable input matching network 21 and the tunable output matching network 22 include first and second segmented variable capacitor arrays 5, 6, respectively.

The first segmented variable capacitor array 5 receives the control signal CNTL, which can be used to control the first segmented variable capacitor array's capacitance. The capacitance of the first segmented variable capacitor array 5 can be used to control, for example, an input impedance of the RF circuit 15 and/or to control a ratio of impedance transformation provided by the tunable input matching network 21. Additionally, the capacitance of the second segmented variable capacitor array 6 can be controlled by the control signal CNTL, thereby controlling, for example, an output impedance of the RF circuit 15 and/or a ratio of impedance transformation provided by the tunable output matching network 22.

Including the tunable input matching network 21 and the tunable output matching network 22 can enhance performance in a variety of ways, such as improving performance under varying voltage standing wave ratio (VSWR). The first and second segmented variable capacitor arrays 5, 6 can be implemented in accordance with the teachings herein to provide high RF voltage handling capabilities, high Q-factor, low insertion loss, and/or high linearity.

FIG. 1C is a schematic diagram of another embodiment of an RF system 30 that includes an antenna tuning circuit 31 and an antenna 2. The antenna tuning circuit 31 is electrically connected between an RF terminal IN and the antenna 2.

As shown in FIG. 1C, the antenna tuning circuit 31 includes the segmented variable capacitor array 5, which can be controlled using the control signal CNTL. The capacitance of the segmented variable capacitor array 5 can be used, for example, to control an impedance transformation provided by the antenna tuning circuit 31 and/or a standing wave ratio at the RF terminal IN.

Although the RF systems of FIGS. 1A-1C illustrate various examples of electronic systems that can include one or more segmented variable capacitor arrays, the segmented variable capacitor arrays described herein can be used in other electronic systems. For example, segmented variable capacitor arrays can be used in wide range of RF electronics, including, for example, programmable filters, programmable resonators, programmable antenna tuners, programmable impedance matching networks, programmable phase shifters, and/or programmable duplexers.

FIG. 2 is a schematic diagram of an integrated circuit (IC) 60 according to one embodiment. The IC 60 includes a first segmented variable capacitor array 61, a second segmented variable capacitor array 62, a third segmented variable capacitor array 63, and a bias voltage generation circuit 64. Details related to the segmentation of the variable capacitor arrays 61-63 are omitted from FIG. 2 for clarity. However, the variable capacitor arrays 61-63 can be segmented as described further below with reference to FIGS. 7-11. The IC 60 includes a first RF input $RF_{IN1}$, a second RF input $RF_{IN2}$, a third RF input $RF_{IN3}$, a first RF output $RF_{OUT1}$, a second RF output $RF_{OUT2}$, and a third RF output $RF_{OUT3}$.

The first segmented variable capacitor array 61 includes a first variable capacitor cell 71a, a second variable capacitor cell 71b, and a third variable capacitor cell 71c. The first to third capacitor cells 71a-71c are electrically connected in parallel between the first RF input $RF_{IN1}$ and the first RF output $RF_{OUT1}$. The second segmented variable capacitor array 62 includes a first variable capacitor cell 72a, a second variable capacitor cell 72b, and a third variable capacitor cell 72c. The first to third capacitor cells 72a-72c are electrically connected in parallel between the second RF input $RF_{IN2}$ and the second RF output $RF_{OUT2}$. The third segmented variable capacitor array 63 includes a first variable capacitor cell 73a, a second variable capacitor cell 73b, and a third variable capacitor cell 73c. The first to third capacitor cells 73a-73c are electrically connected in parallel between the third RF input $RF_{IN3}$ and the third RF output $RF_{OUT3}$.

Although FIG. 2 illustrates the IC 60 as including three segmented variable capacitor arrays, the IC 60 can be adapted to include more or fewer segmented variable capacitor arrays. In one embodiment, the IC 60 includes between about 4 and about 16 segmented variable capacitor arrays. In another embodiment, the IC 60 includes between about 1 and about 3 segmented variable capacitor arrays. However, other configurations are possible.

Additionally, although FIG. 2 illustrates each segmented variable capacitor array as including three variable capacitor cells, the segmented variable capacitor arrays can include additional variable capacitor cells as indicated by the ellipses.

The bias voltage generation circuit 64 receives the control signal CNTL, and generates a first bias voltage $V_{BIAS1}$, a second bias voltage $V_{BIAS2}$, and a third bias voltage $V_{BIAS3}$. The bias voltage generation circuit 64 includes at least one MSB decoder and at least one LSB decoder, as will be described in detail further below with reference to FIGS. 7-11. As shown in FIG. 2, the first bias voltage $V_{BIAS1}$ is provided to the first variable capacitor cell 71a of the first segmented variable capacitor array 61, to the first variable capacitor cell 72a of the second segmented variable capacitor array 62, and to the first variable capacitor cell 73a of the third segmented variable capacitor array 63. Additionally, the second bias voltage $V_{BIAS2}$ is provided to the second variable capacitor cell 71b of the first segmented variable capacitor array 61, to the second variable capacitor cell 72b of the second segmented variable capacitor array 62, and to the second variable capacitor cell 73b of the third segmented variable capacitor array 63. Furthermore, the third bias voltage $V_{BIAS3}$ is provided to the third variable capacitor cell 71c of the first segmented variable capacitor array 61, to the third variable capacitor cell 72c of the second segmented variable capacitor array 62, and to the third variable capacitor cell 73c of the third segmented variable capacitor array 63.

The bias voltage generation circuit 64 can be used to control the voltage levels of the first, second, and third bias voltages $V_{BIAS1}$-$V_{BIAS3}$ to control the capacitances of the first to third segmented variable capacitor arrays 61-63.

The illustrated variable capacitor cells can be implemented using MOS capacitors. For example, in certain configurations, a particular variable capacitor cell includes MOS capacitors implemented in anti-series or anti-parallel configurations. Configuring a variable capacitor cell in this manner can help control the variation in the cell's capacitance in the presence of RF signals and/or cancel second-order intermodulation tones (IM2). Additionally, the first to third bias voltages $V_{BIAS1}$-$V_{BIAS3}$ can be used to bias the MOS capacitors at two or more bias voltages associated with a small amount of capacitance variation, and thus with high linearity. For example, in one embodiment, the first to third bias voltages $V_{BIAS1}$-$V_{BIAS3}$ can be selectively controlled to bias the MOS capacitors in accumulation or inversion to control the overall capacitance of the arrays.

In certain configurations, the MOS capacitors can be fabricated using silicon on insulator (SOI) processes. However, other configurations are possible, including, for example, implementations in which the MOS capacitors are fabricated using deep sub-micron (DSM) complementary metal oxide semiconductor (CMOS) processes.

As shown in FIG. 2, the bias voltage generation circuit 64 receives the control signal CNTL, which can be used to select the voltage levels of the first, second, and third bias voltages $V_{BIAS1}$-$V_{BIAS3}$.

The IC 60 includes a first signal path from the first RF input $RF_{IN1}$ to the first RF output $RF_{OUT1}$ through the first segmented variable capacitor array 61. Additionally, the IC 60 includes a second signal path from the second RF input $RF_{IN2}$ to the second RF output $RF_{OUT2}$ through the second segmented variable capacitor array 62, and a third signal path from the third RF input $RF_{IN3}$ to the third RF output $RF_{OUT3}$ through the third segmented variable capacitor array 63.

In certain embodiments, the IC 60 does not include any switches in the signal paths between the IC's inputs and outputs through the segmented variable capacitor arrays. By configuring the segmented variable capacitor arrays in this manner, the segmented variable capacitor arrays can have lower insertion loss and/or higher linearity relative to a configuration in which capacitance is provided by selecting discrete capacitors via switches.

As shown in FIG. 2, multiple segmented variable capacitor arrays can be fabricated on a common IC, and can share control signals but receive different RF signals. However, other configurations are possible, such as implementations in which the segmented variable capacitor arrays receive separate control signals.

Figure 3A:
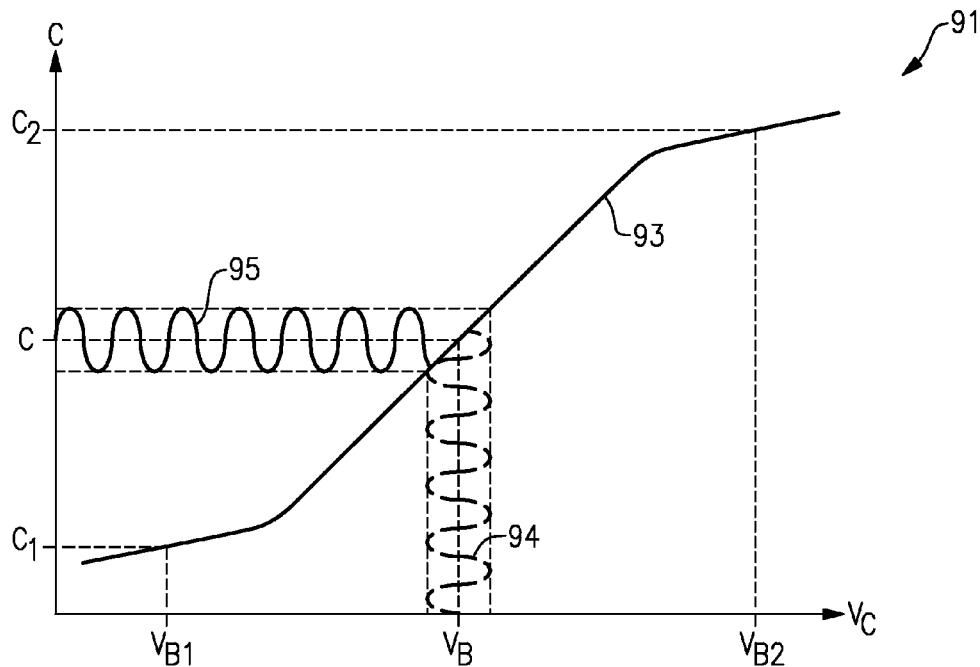
FIGS. 3A and 3B are graphs of two examples of capacitance versus bias voltage.
Figure 3B:
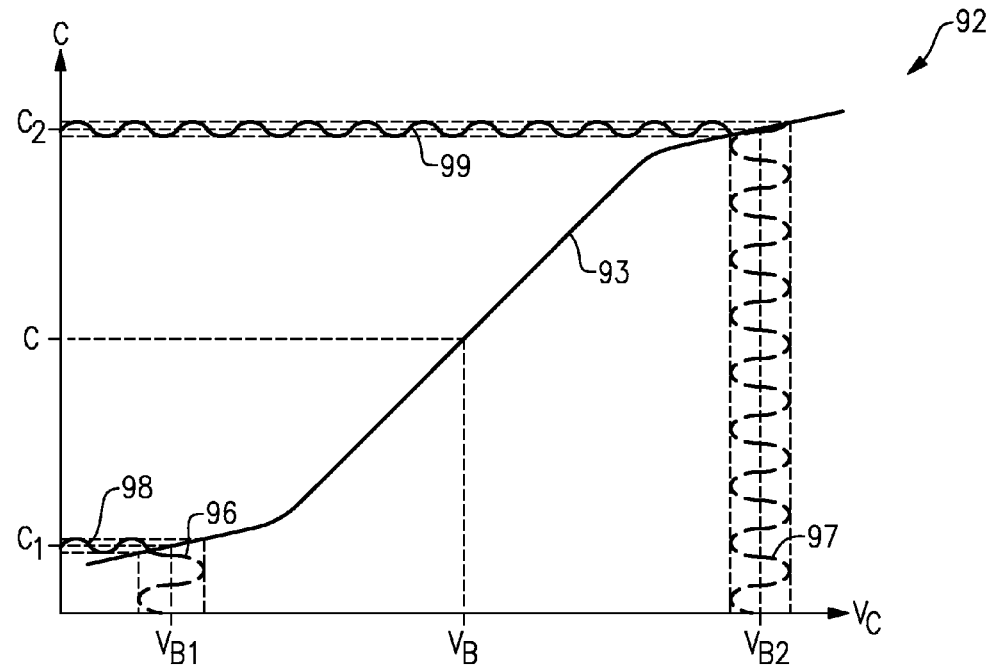

FIGS. 3A and 3B are graphs of two examples of capacitance versus bias voltage. FIG. 3A includes a first graph 91 of capacitance versus voltage, and FIG. 3B includes a second graph 92 of capacitance versus voltage.

The first graph 91 includes a high frequency capacitance-voltage (CV) plot 93 for one example of an n-type MOS capacitor. As shown in the CV plot 93, the capacitance of the MOS capacitor can increase with bias voltage level. The increase in capacitance can be associated with the MOS capacitor transitioning between operating regions or modes. For example, at low bias voltage levels, the MOS capacitor can operate in an accumulation mode in which a majority carrier concentration near the gate dielectric/semiconductor interface is greater than a background majority carrier concentration of the semiconductor. Additionally, as the voltage level of the bias voltage increases, the MOS capacitor can transition from the accumulation mode to a depletion mode in which minority and majority carrier concentrations near the gate dielectric/semiconductor interface are less than the background majority carrier concentration. Furthermore, as the voltage level of the bias voltage further increases, the MOS capacitor can transition from the depletion mode to an inversion mode in which the minority carrier concentration near the gate dielectric/semiconductor interface is greater than the background majority carrier concentration.

The first graph 91 has been annotated to include an AC signal component 94 when biasing the MOS capacitor at a bias voltage level $V_B$. When the AC signal component 94 is not present, the MOS capacitor can have a capacitance C. However, as shown by in FIG. 3A, the AC signal component 94 can generate a capacitance variation 95. The capacitance variation 95 can be associated with a capacitance variation generated by the AC signal component 94.

With reference to FIG. 3B, the second graph 92 includes the CV plot 93, which can be as described above. The second graph 92 has been annotated to include a first AC signal component 96 associated with biasing the MOS capacitor at a first bias voltage level $V_{B1}$, and a second AC signal component 97 associated with biasing the MOS capacitor at a second bias voltage level $V_{B2}$.

As shown in FIG. 3B, the first AC signal component 96 can generate a first capacitance variation 98, and the second AC signal component 97 can generate a second capacitance variation 99.

When biased at the first bias voltage level $V_{B1}$ or the second bias voltage level $V_{B2}$, the MOS capacitor can nevertheless have a capacitance that varies in the presence of AC signals. However, the first and second bias voltage levels $V_{B1}$, $V_{B2}$ can be associated with DC bias points of the MOS capacitor having relatively small capacitance variation or change.

Accordingly, in contrast to the capacitance variation 95 of FIG. 3A which has a relatively large magnitude, the first and second capacitance variations 98, 99 of FIG. 3B have a relatively small magnitude.

In certain embodiments herein, a segmented variable capacitor array includes MOS capacitors that are biased at bias voltages associated with small capacitance variation. By biasing the MOS capacitors in this manner, a segmented variable capacitor array can exhibit high linearity.

Such a segmented variable capacitor array can also have less capacitance variation when operated in a system using multiple frequency bands. For example, when included in a programmable duplexer, such as the programmable duplexer 1 of FIG. 1A, the segmented variable capacitor array can provide relatively constant capacitance even when tuned to frequency bands that are separated by a wide frequency.

In certain embodiments, the first bias voltage level $V_{B1}$ is selected to operate in the MOS capacitor in an accumulation mode, and the second bias voltage level $V_{B2}$ is selected to operate the MOS capacitor in an inversion mode. In certain configurations, biasing a MOS capacitor in this manner can achieve a capacitance tuning range of 3:1 or more. However, other tuning ranges can be realized, including, for example, a tuning range associated with a particular manufacturing process used to fabricate the MOS capacitor.

Figure 4A:
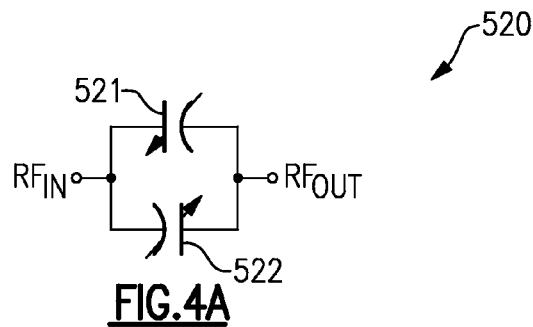
FIG. 4A is a circuit diagram of a variable capacitor cell according to one embodiment.

FIG. 4A is a schematic diagram of a variable capacitor cell 520 according to one embodiment. The variable capacitor cell 520 includes a first variable capacitor 521 and a second variable capacitor 522. The variable capacitor cell 520 further includes an RF input $RF_{IN}$ and an RF output $RF_{OUT}$.

The first variable capacitor 521 includes an anode electrically connected to the RF input $RF_{IN}$ and a cathode electrically connected to the RF output $RF_{OUT}$. The second variable capacitor 522 includes an anode electrically connected to the RF output $RF_{OUT}$ and a cathode electrically connected to the RF input $RF_{IN}$.

In the illustrated configuration, an anode structure of the first and second variable capacitors 521, 522 is different than a cathode structure of the first and second variable capacitors 521, 522. For example, the first and second variable capacitors 521, 522 can be implemented by first and second MOS capacitors, respectively. Additionally, the first and second MOS capacitors can have anodes associated with transistor gates and cathodes associated with transistor source and/or drain regions.

The first and second variable capacitors 521, 522 have been implemented in an anti-parallel or inverse parallel configuration. Electrically connecting the first and second variable capacitors 521, 522 in this manner can enhance the robustness of the capacitors to capacitance variation in the presence of RF signals. For example, when the first and second variable capacitors are each biased with a particular bias voltage, the variable capacitors' capacitance may change when an RF input signal is received on the RF input $RF_{IN}$. However, a capacitance variation AC of the first and second variable capacitors 521, 522 can have about equal magnitude, but opposite polarity. For instance, in the presence of an RF input signal that generates a capacitance variation having a magnitude ΔC, the first variable capacitor 521 may have a capacitance $C_V$+ΔC, while the second variable capacitor 522 may have a capacitance $C_V$−ΔC. Since the first and second variable capacitors 521, 522 are electrically connected in parallel with one another, an overall capacitance of the first and second variable capacitors 521, 522 can be about equal to 2*$C_V$.

Accordingly, the illustrated configuration can provide reduced capacitance variation in the presence of RF signals. Furthermore, the illustrated variable capacitor cell 520 can exhibit high linearity.

Figure 4B:
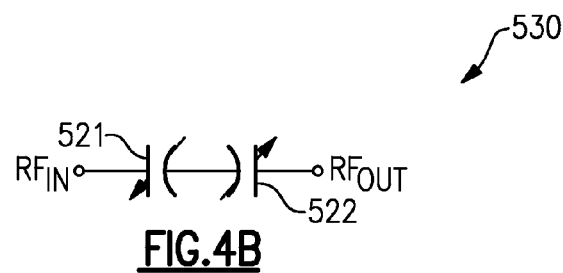
FIG. 4B is a circuit diagram of a variable capacitor cell according to another embodiment.

FIG. 4B is a schematic diagram of a variable capacitor cell 530 according to another embodiment. The variable capacitor cell 530 includes the first and second variable capacitors 521, 522.

The variable capacitor cell 530 of FIG. 4B is similar to the variable capacitor cell 520 of FIG. 4A, except that the variable capacitor cell 530 includes a different arrangement of the first and second variable capacitors 521, 522. In particular, in contrast to the variable capacitor cell 520 of FIG. 4A which implements the first and second variable capacitors 521, 522 in an anti-parallel configuration, the variable capacitor cell 530 of FIG. 4B implements the first and second variable capacitors 521, 522 in an anti-series or inverse series configuration.

For example, the first variable capacitor 521 includes an anode electrically connected to the RF input $RF_{IN}$, and a cathode electrically connected to a cathode of the second variable capacitor 522. Additionally, the second variable capacitor 522 further includes an anode electrically connected to first and second variable capacitors 521, 522.

Configuring the variable capacitor cell 530 in this manner can reduce variation of the cell's capacitance in the presence of an RF input signal at the RF input $RF_{IN}$.

Although the variable capacitor cell 530 of FIG. 4B can have a smaller capacitance relative to the variable capacitor cell 520 of FIG. 4A for a given bias voltage level and transistor sizes, the variable capacitor cell 530 of FIG. 4B can have a higher voltage handling capability relative to the variable capacitor cell 520 of FIG. 4A.

The variable capacitor cell 530 of FIG. 4B shows an anti-series configuration in which the cathodes of the first and second variable capacitors 521, 522 electrically connected to one another and the anodes of the first and second variable capacitors 521, 522 are electrically connected to the RF input $RF_{IN}$ and the RF output $RF_{OUT}$, respectively. However, the teachings herein are also applicable to anti-series configurations in which the anodes of the first and second variable capacitors 521, 522 are electrically connected to one another and the cathodes of the first and second variable capacitors 521, 522 are electrically connected to the RF input $RF_{IN}$ and the RF output $RF_{OUT}$, respectively.

For example, such a configuration can be more robust against damage from electrostatic discharge (ESD) events. For instance, the anodes of the first and second variable capacitors 521, 522 can be associated with gates of MOS capacitors and the cathodes of the first and second variable capacitors 521, 522 can be associated with source and/or drain regions of MOS capacitors. Since, a MOS capacitor's source and drain regions typically can withstand a greater voltage relative to the MOS capacitor's gate region, an anti-series variable capacitor cell with cathodes electrically connected to input and output pins may exhibit a greater robustness to ESD events or other overvoltage conditions relative to an anti-series variable capacitor cell with anodes electrically connected to input and output pins.

Although FIGS. 4A-4B illustrate two examples of variable capacitor cells suitable for use with the segmented variable capacitor arrays described herein, the segmented variable capacitor arrays can be implemented using other configurations of variable capacitor cells. In one embodiment, a segmented variable capacitor array includes variable capacitor cells implemented using a single MOS capacitor. Configuring the segmented variable capacitor array in this manner can provide a compact area at the expense of a decrease in performance, such as poorer linearity and/or lower power handling capability.

Figure 5A:
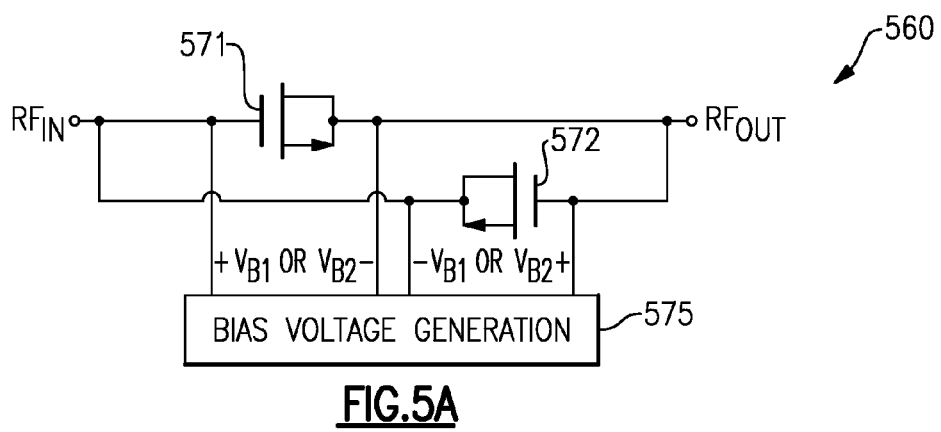
FIG. 5A is a circuit diagram of a variable capacitor cell according to another embodiment.

FIG. 5A is a schematic diagram of a metal oxide semiconductor (MOS) variable capacitor cell 560 according to one embodiment. The MOS variable capacitor cell 560 includes a first MOS capacitor 571 and a second MOS capacitor 572. The MOS variable capacitor cell 560 further includes an RF input $RF_{IN}$ and an RF output $RF_{OUT}$.

Electrical connections between the MOS variable capacitor cell 560 and a bias voltage generation circuit 575 have been illustrated in FIG. 5A. Although not illustrated in FIG. 5A, the bias voltage generation circuit 575 can be used to bias additional MOS variable capacitor cells.

The RF input $RF_{IN}$ is electrically connected to a gate of the first MOS capacitor 571 and to a source and drain of the second MOS capacitor 572. Additionally, the RF output $RF_{OUT}$ is electrically connected to a gate of the second MOS capacitor 572 and to a source and drain of the first MOS capacitor 571.

As shown in FIG. 5A, the bias voltage generation circuit 575 can be used to bias the first and second MOS capacitors 571, 572 at a first bias voltage level $V_{B1}$ or at a second bias voltage level $V_{B2}$. Although omitted from FIG. 5A for clarity of the figures, the MOS variable capacitor cell 560 can include additional structures to aid in biasing, including, for example, resistors and/or DC blocking capacitors to aid in providing the desired bias voltages.

In one embodiment, the first and second MOS capacitors 571, 572 operate in accumulation when biased at the first bias voltage level $V_{B1}$ and operate in inversion when biased at the second bias voltage level $V_{B2}$. Biasing the first and second MOS capacitors 571, 572 in this manner can improve linearity relative to a configuration in which the first and second MOS capacitors 571, 572 are biased at a bias voltage level selected from a continuous tuning voltage range. For example, a MOS capacitor can exhibit a change in capacitance in response to changes in an applied RF signal, and a magnitude of the capacitance change can vary with the MOS capacitor's bias voltage level.

Figure 5B:
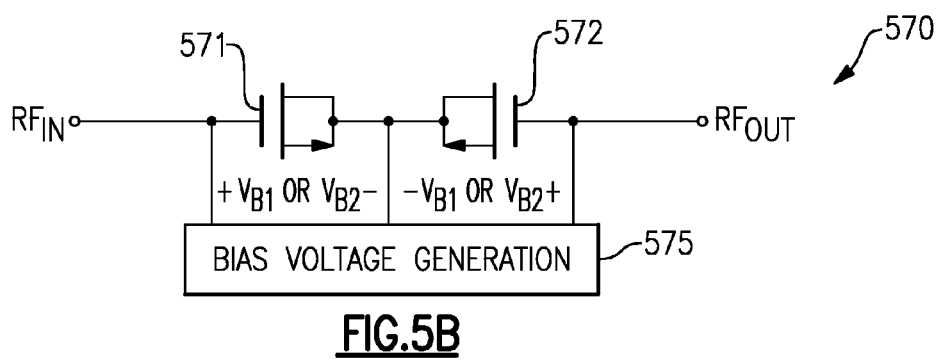
FIG. 5B is a circuit diagram of a variable capacitor cell according to another embodiment.

FIG. 5B is a schematic diagram of a MOS variable capacitor cell 570 according to another embodiment. The MOS variable capacitor cell 570 includes first and second MOS capacitors 571, 572. Electrical connections between the MOS variable capacitor cell 570 and the bias voltage generation circuit 575 have been illustrated in FIG. 5B.

The MOS variable capacitor cell 570 of FIG. 5B is similar to the MOS variable capacitor cell 560 of FIG. 5A, except that the MOS variable capacitor cell 570 of FIG. 5B implements the first and second MOS capacitors 571, 572 in an anti-series configuration, rather than in an anti-parallel configuration.

For example, in the illustrated configuration, the gate of the first MOS capacitor 571 is electrically connected to the RF input $RF_{IN}$, and the gate of the second MOS capacitor 572 is electrically connected to the RF output $RF_{OUT}$. Additionally, the source and drain of the first MOS capacitor 571 are electrically connected to the source and drain of the second MOS capacitor 572. As shown in FIG. 5B, the bias voltage generation circuit 575 can be used to bias the first and second MOS capacitors 571, 572 at the first bias voltage level $V_{B1}$ or at the second bias voltage level $V_{B2}$.

Although FIG. 5B illustrates an anti-series configuration in which the cathodes of the first and second MOS capacitors are electrically connected to one another, the teachings herein also applicable to anti-series configurations in which the anodes of the first and second MOS capacitors are electrically connected to one another. For example, in another embodiment, the source and drain of the first MOS capacitor 571 are electrically connected to the RF input $RF_{IN}$, and the source and drain of the second MOS capacitor 572 are electrically connected to the RF output $RF_{OUT}$. Additionally, the gate of the first MOS capacitor 571 is electrically connected to the gate of the second MOS capacitor 572.

Although omitted from FIG. 5B for clarity of the figures, the MOS variable capacitor cell 570 can include additional structures to aid in biasing. In one embodiment, the gates of the first and second MOS capacitors 571, 572 are biased via resistors to a DC bias voltage, for instance, a ground voltage, and an MSB or LSB control signal biases the sources and drains of the first and second MOS capacitors 571, 572 via resistors to one of two voltage levels. Thus, the voltage level of the MSB or LSB control signal can be controlled to provide the first bias voltage level $V_{B1}$ or at the second bias voltage level $V_{B2}$ across the MOS capacitors 571, 572. In another embodiment, the first and second MOS capacitors 571, 572 are implemented in an anti-series configuration in which the gates of the first and second MOS capacitors are electrically connected to one another. Additionally, the source and drains of the first and second MOS capacitors 571, 572 are biased via resistors to a DC bias voltage, for instance, a ground voltage, and an MSB or LSB control signal biases the gates of the first and second MOS capacitors 571, 572 via resistors to one of two voltage levels.

Figure 6:
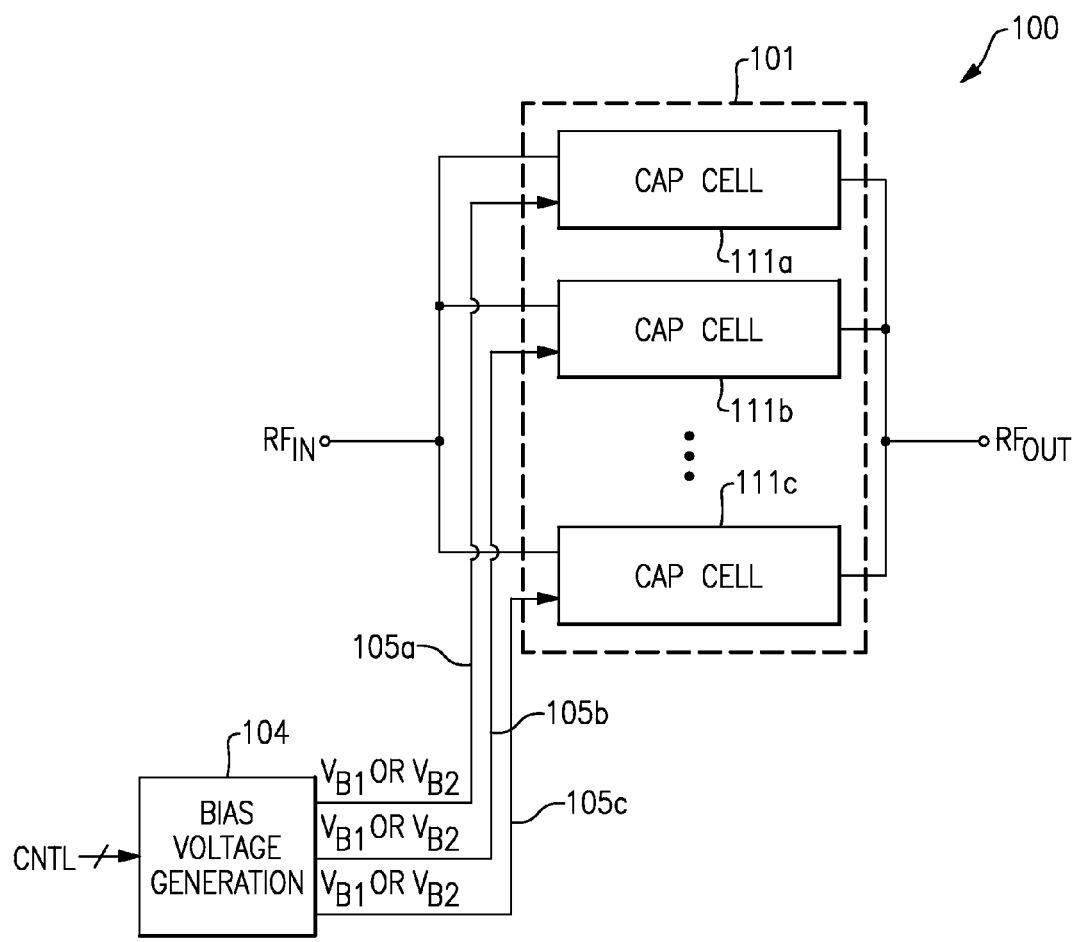
FIG. 6 is a schematic diagram of an IC according to another embodiment.

FIG. 6 is a schematic diagram of an IC 100 according to another embodiment. The IC 100 includes a segmented variable capacitor array 101 and a bias voltage generation circuit 104. Details related to the segmentation of the variable capacitor array 101 are omitted from FIG. 6 for clarity. However, the variable capacitor array 101 can be segmented as described further below with reference to FIGS. 7-11. Although FIG. 6 illustrates a configuration in which the IC 100 includes one segmented variable capacitor array, the IC 100 can be adapted to include additional segmented variable capacitor arrays and/or other circuitry.

The segmented variable capacitor array 101 includes a first variable capacitor cell 111a, a second variable capacitor cell 111b, and a third variable capacitor cell 111c, which have been electrically connected in parallel between an RF input $RF_{IN}$ and an RF output $RF_{OUT}$. Although the segmented variable capacitor array 101 is illustrated as including three variable capacitor cells, the segmented variable capacitor array 101 can include additional variable capacitor cells as indicated by the ellipses.

The bias voltage generation circuit 104 receives the control signal CNTL, and generates a first bias or control signal 105a for the first variable capacitor cell 111a, a second bias signal 105b for the second variable capacitor cell 111b, and a third bias signal 105c for the third variable capacitor cell 111c.

In the illustrated configuration, the control signal CNTL can be used to set the voltage level of the first bias signal 105a to a first bias voltage level $V_{B1}$ or to a second bias voltage level $V_{B2}$. Similarly, the control signal CNTL can be used to set the voltage level of the second bias signal 105b to the first bias voltage level $V_{B1}$ or to the second bias voltage level $V_{B2}$, and to set the voltage level of the third bias signal 105c to the first bias voltage level $V_{B1}$ or to the second bias voltage level $V_{B2}$.

By controlling the voltage levels of the bias signals to the first or second bias voltage levels $V_{B1}$, $V_{B2}$, the segmented variable capacitor array 101 can exhibit a small variation in capacitance in the presence of an RF signal at the RF input $RF_{IN}$. Accordingly, the segmented variable capacitor array 101 can exhibit high linearity in the presence of RF signals.

The control signal CNTL can control an overall capacitance of the segmented variable capacitor array 101. For example, the size of the first, second, and third MOS capacitor cells 111a-111c can be weighted relative to one another, and an overall capacitance of the variable capacitor array 101 can be based on a sum of the capacitances of the array's variable capacitor cells. The MOS capacitor cells 111a-111c are weighted based on a selected segmentation scheme, as will be described in detail further below with respect to FIGS. 7-11.

As shown in FIG. 6, the bias voltage generation circuit 104 can control the bias or control signal of a particular variable capacitor cell to the first bias voltage level $V_{B1}$ or the second bias voltage level $V_{B2}$. Configuring the bias voltage generation circuit 104 to control a bias signal to one of two voltage levels associated with high linearity can enhance performance.

Figure 7:
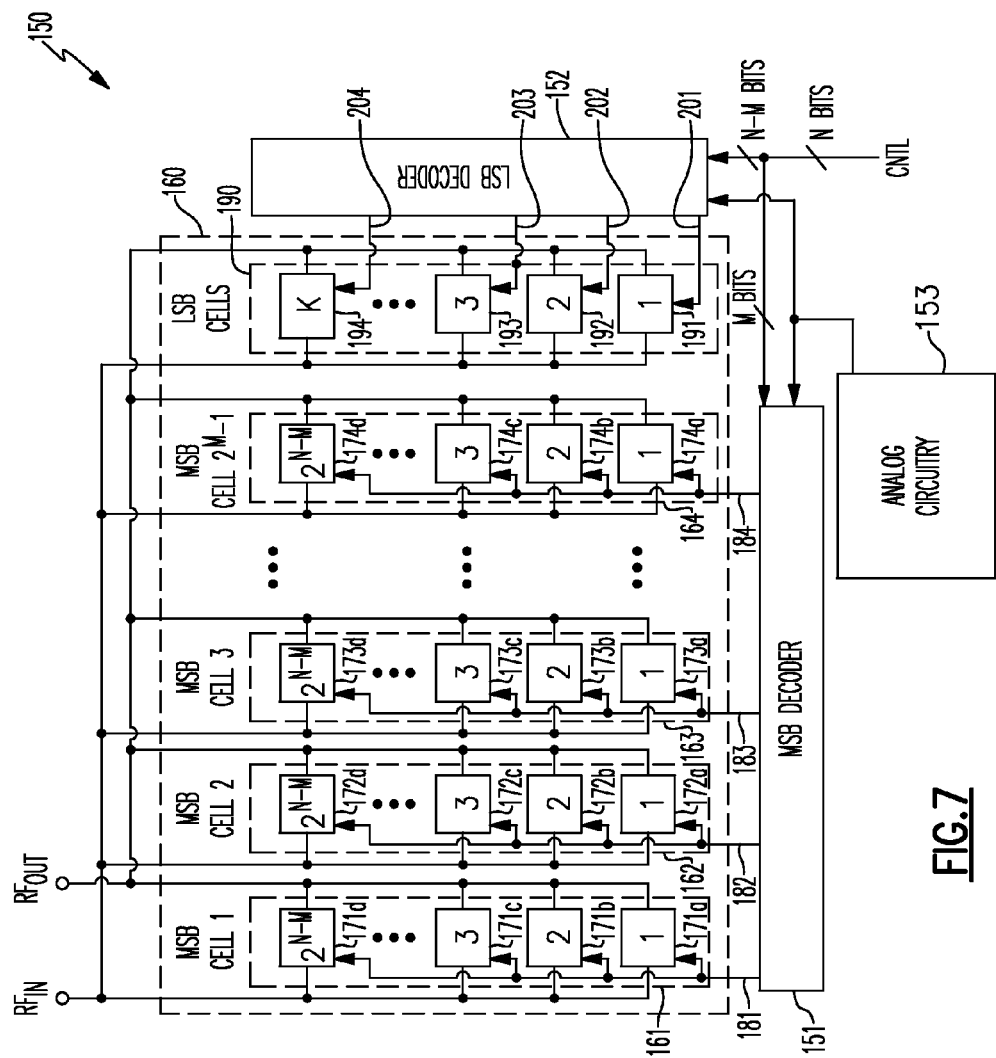
FIG. 7 is a schematic diagram of a segmented variable capacitor array according to one embodiment.

FIG. 7 is a schematic diagram of a segmented variable capacitor array 150 according to one embodiment. The segmented variable capacitor array 150 includes a primary or MSB decoder 151, a secondary or LSB decoder 152, analog circuitry 153, and an array of variable capacitor cells 160. The segmented variable capacitor array 150 includes an RF input $RF_{IN}$ and an RF output $RF_{OUT}$, and receives a multi-bit digital control signal CNTL carrying N bits.

In certain configurations, N is selected to be in the range of about 3 to about 12. In one embodiment, N is at least 4.

As shown in FIG. 7, the array of variable capacitor cells 160 includes a plurality of MSB cells including a first MSB cell 161, a second MSB cell 162, a third MSB cell 163, and a $2^M$-1 MSB cell 164. In the illustrated configuration, the plurality of MSB cells 161-164 includes $2^M$-1 total MSB cells, where M is an integer greater than or equal to 2, and N-M is an integer greater than or equal to 2. In one embodiment, M is at least equal to 3, for example, between about 3 and about 6, and N-M is at least equal to 3, for example, between about 3 and about 6. The illustrated MSB decoder 151 generates an MSB control signal for each of the MSB cells 161-164. For example, the illustrated MSB decoder 151 generates a first MSB control signal 181 for the first MSB cell 161, a second MSB control signal 182 for the second MSB cell 162, a third MSB control signal 183 for the third MSB cell 163, and a $2^M$-1 MSB control signal 184 for the $2^M$-1 MSB cell 164.

As shown in FIG. 7, each of the MSB cells 161-164 comprise a plurality of unit capacitance cells, which have about the same nominal capacitance. For example, the first MSB cell 161 includes $2^{N-M}$ unit capacitance cells, including a first unit capacitance cell 171a, a second unit capacitance cell 171b, a third unit capacitance cell 171c, and a 2N-M unit capacitance cell 171d. Additionally, the second MSB cell 162 includes $2^{N-M}$ unit capacitance cells, including a first unit capacitance cell 172a, a second unit capacitance cell 172b, a third unit capacitance cell 172c, and a $2^{N-M}$ unit capacitance cell 172d. Furthermore, the third MSB cell 163 includes $2^{N-M}$ unit capacitance cells, including a first unit capacitance cell 173a, a second unit capacitance cell 173b, a third unit capacitance cell 173c, and a 2N-M unit capacitance cell 173d. Additionally, the fourth MSB cell 164 includes $2^{N-M}$ unit capacitance cells, including a first unit capacitance cell 174a, a second unit capacitance cell 174b, a third unit capacitance cell 174c, and a $2^{N-M}$ unit capacitance cell 174d.

As shown in FIG. 7, the unit capacitance cells of a particular MSB cell are electrically connected in parallel with one another and each receive the MSB control signal provided to that MSB cell from the MSB decoder 151. For example, the first MSB cell 161 receives the first MSB control signal 181, which is provided to each of the unit capacitance cells 171a-171d. Thus, the MSB decoder 151 biases each unit capacitance cell of a particular MSB cell with a common control signal.

The array of variable capacitor cells 160 further includes LSB cells 190, which include a first LSB cell 191, a second LSB cell 192, a third LSB cell 193, and a Kth LSB cell 194. In the illustrated configuration, the plurality of LSB cells 191-194 includes K total LSB cells. In certain configurations, the LSB cells 191-194 comprise arrays of unit capacitance cells that are binary-weighted and K is selected to be equal to N-M. However, other configurations are possible. For example, in one embodiment, the LSB cells comprise $2^{N-M-1}$ unit capacitance cells, and the LSB decoder 152 comprises a thermometer decoder.

The illustrated LSB decoder 152 generates an LSB control signal for each of the LSB cells 191-194. For example, the illustrated LSB decoder 152 generates a first LSB control signal 201 for the first LSB cell 191, a second LSB control signal 202 for the second LSB cell 192, a third LSB control signal 203 for the third LSB cell 193, and a Kth LSB control signal 204 for the Kth LSB cell 194.

In certain configurations, the layout of the segmented variable capacitor array 150 is implemented such that the MSB decoder 151 is elongated or extends in a first or horizontal direction and the LSB decoder 152 is elongated or extends in a second or vertical direction substantially perpendicular to the first direction. Orientating the decoders in this manner can aid in providing the segmented variable capacitor array 150 with a compact layout. Although FIG. 7 illustrates the MSB decoder 151 positioned along a bottom-edge of the array of variable capacitor cells 160 and the LSB decoder 152 positioned along a right-edge of the array of variable capacitor cells 160, other configurations are possible. For example, in one embodiment the MSB decoder 151 is positioned in about the middle of the array of variable capacitor cells 160, thereby dividing the array of variable capacitor cells 160 into a top-half and a bottom-half. Configuring the segmented variable capacitor array 150 in this manner can improve the array's switching time by reducing a length of conductors that carry MSB control signals.

Each of the MSB cells 161-164 has a nominal capacitance that is greater than a nominal capacitance of each of the LSB cells 191-194. In certain configurations, the MSB cells 161-164 each have a nominal capacitance that is about equal to a factor of 2N-M times a unit capacitance of one the unit capacitance cells, and each of the LSB cells 191-194 have a nominal capacitance less than $2^{N-M}$ times the unit capacitance.

In certain configurations, the LSB cells 191-194 have a difference nominal capacitance from one another. For example, in one embodiment, the LSB cells 191-194 can be binary-weighted with nominal capacitances ranging from a smallest LSB cell with about 1 times the unit capacitance to a largest LSB cell with about $2^{N-M-1}$ times the unit capacitance.

However, the LSB cells 191-194 need not have different nominal capacitances. For example, the LSB cells 191-194 can each have about 1 times the unit capacitance and the LSB decoder 152 can comprise a thermometer decoder.

In the illustrated configuration, the MSB decoder 151 receives M bits of the N bit control signal CNTL. The MSB decoder 151 decodes the M bits to generate the MSB control signals 181-184. Additionally, the LSB decoder 152 receives N-M bits of the N bit control signal CNTL. Additionally, the LSB decoder 152 decodes the N-M bits to generate the LSB control signals 201-204.

In certain configurations, the array of variable capacitor cells 160 comprises a plurality of MOS variable capacitor cells. For example, the MOS variable capacitor cells can include pairs of MOS capacitors implemented in anti-series and/or anti-parallel configurations, as was described earlier with respect to FIGS. 5A-5B. Additionally, the MSB control signals 181-184 and the LSB control signals 201-204 can be used to provide bias voltages to the MOS variable capacitor cells to control an overall capacitance of the array. For example, in one embodiment, the MSB control signals 181-184 and the LSB control signals 201-204 are selectively controlled to one of two bias voltage levels to bias the MOS variable capacitor cells.

The illustrated segmented variable capacitor array 150 includes the analog circuitry 153, which can be used to provide one or more voltages to the MSB decoder 151 and the LSB decoder 152. In certain configurations, the analog circuitry 153 generates at least one bias voltage level that can be used to bias the variable capacitor cells of the segmented variable capacitor array 160. For example, in embodiments in which the segmented variable capacitor array 150 comprises MOS variable capacitor cells, the analog circuitry 153 can be used to generate the first bias voltage level $V_{B1}$ and/or the second bias voltage level $V_{B2}$ discussed earlier in connection with FIGS. 3A-3B and 5A-6.

The illustrated segmented variable capacitor array 150 employs segmenting to enhance performance. For example, the segmented variable capacitor array 150 can have a shorter switching time relative to a configuration in which the array of variable capacitor cells 160 comprises N cells that are binary-weighted with respect to one another. For instance, in the illustrated configuration, the capacitive loading of the MSB control signals 181-184 can be relatively small, which can decrease RC time constants associated with switching the MSB control signals from one voltage level to another. Additionally, the capacitive loading of the MSB control signals 181-184 can be well-balanced, which can relax constraints on the analog circuitry 153 in configurations in which the analog circuitry 153 generates one or more of the voltage levels to which the MSB and/or LSB control signals can be selectively controlled to. Furthermore, the segmented variable capacitor array 150 can have a fewer number of control signals relative to a configuration in which the array of variable capacitor cells 160 comprises $2^N$-1 unit capacitance cells that are individually controlled with separate control signals. Accordingly, the segmented variable capacitor array 150 can exhibit faster switching time, smaller area, and/or improved performance.

Figure 8:
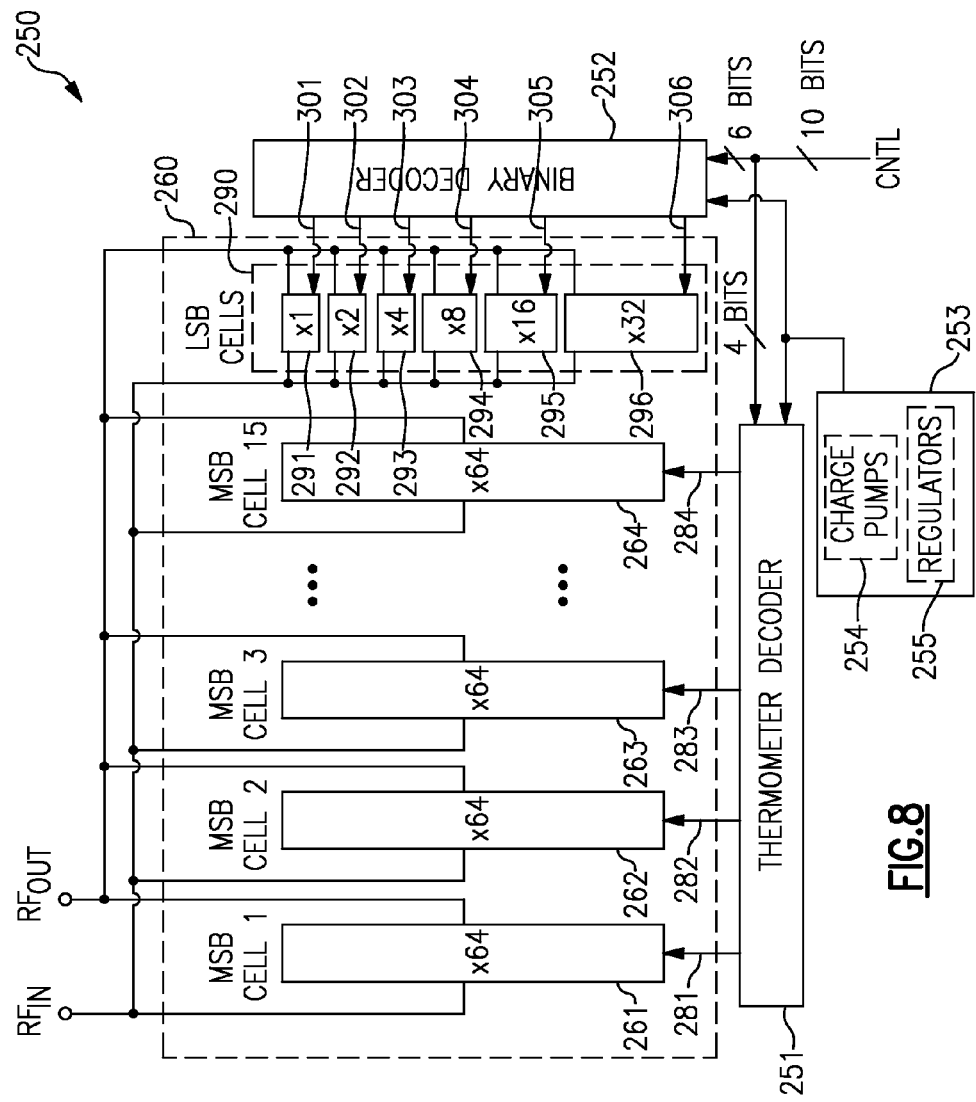
FIG. 8 is a schematic diagram of a segmented variable capacitor array according to another embodiment.

FIG. 8 is a schematic diagram of a segmented variable capacitor array 250 according to another embodiment. The segmented variable capacitor array 250 comprises a 4-bit MSB thermometer decoder 251, a 6-bit LSB binary decoder 252, analog circuitry 253, and an array of variable capacitor cells 260. The segmented variable capacitor array 250 includes an RF input $RF_{IN}$ and an RF output $RF_{OUT}$, and receives a multi-bit digital control signal CNTL carrying 10 bits.

The array of variable capacitor cells 260 includes fifteen MSB cells including a first MSB cell 161, a second MSB cell 162, a third MSB cell 163, and a fifteenth MSB cell 264. For clarity of the figures, the fourth to fourteenth MSB cells are represented using ellipses in FIG. 8. Each of the MSB cells has about 64 times a unit capacitance. Additionally, each of the MSB cells is electrically connected in parallel between the RF input $RF_{IN}$ and the RF output $RF_{OUT}$. As shown in FIG. 8, the 4-bit MSB thermometer decoder 311 generates MSB control signals for controlling the capacitance of the MSB cells, including a first MSB control signal 281, a second MSB control 282, a third MSB control signal 283, and a fifteenth MSB control signal 284. For clarity of the figures, the fourth to fourteenth MSB control signals are represented using ellipses in FIG. 8.

The array of variable capacitor cells 260 includes six LSB cells including a first LSB cell 291, a second LSB cell 292, a third LSB cell 293, a fourth LSB cell 294, a fifth LSB cell 295, and a sixth LSB cell 296. Each of the LSB cells 291-296 is electrically connected in parallel between the RF input $RF_{IN}$ and the RF output $RF_{OUT}$. The LSB cells 291-296 are binary-weighted, with the first LSB cell 291 having about 1 times the unit capacitance, the second LSB cell 292 having about 2 times the unit capacitance, the third LSB cell 293 having about 4 times the unit capacitance, the fourth LSB cell 294 having about 8 times the unit capacitance, the fifth LSB cell 295 having about 16 times the unit capacitance, and the sixth LSB cell 296 having about 32 times the unit capacitance.

As shown in FIG. 8, the 6-bit LSB binary decoder 252 generates LSB control signals for controlling the capacitance of the LSB cells 291-296. In particular, the 6-bit LSB binary decoder 252 generates a first LSB control signal 301 for controlling the first LSB cell 291, a second LSB control signal 302 for controlling the second LSB cell 292, a third LSB control signal 303 for controlling the third LSB cell 293, a fourth LSB control signal 304 for controlling the fourth LSB cell 294, a fifth LSB control signal 305 for controlling the fifth LSB cell 295, and a sixth LSB control signal 306 for controlling the sixth LSB cell 296.

The illustrated analog circuitry 253 includes one or more charge pumps 254 for generating a first bias voltage level and one or more regulators 255 for generating a second bias voltage level. The first and second bias voltage levels are provided to the 4-bit MSB thermometer decoder 251, which can selectively control each of the MSB control signals 281-284 to either the first bias voltage level or to the second bias voltage level to control an overall capacitance of the MSB cells 261-264. Additionally, the first and second bias voltage levels are provided to the 6-bit LSB binary decoder 252, which can selectively control each of the LSB control signals 301-306 to either the first bias voltage level or to the second bias voltage level to control an overall capacitance of the LSB cells 291-296. Thus, the overall capacitance of the segmented variable capacitor array 250 can be controlled.

Although FIG. 8 illustrates one example of a segmented variable capacitor array in accordance with the teachings herein, other configurations are possible, including, but not limited to, segmented variable capacitor arrays that operate with control signals carrying more or fewer bits, segmented variable capacitor arrays that include different numbers of MSB and/or LSB cells, segmented variable capacitor arrays with different configurations of decoders, and/or segmented variable capacitor arrays using different configurations of analog circuitry.

Additional details of the segmented variable capacitor array 250 can be similar to those described earlier.

Figure 9A:
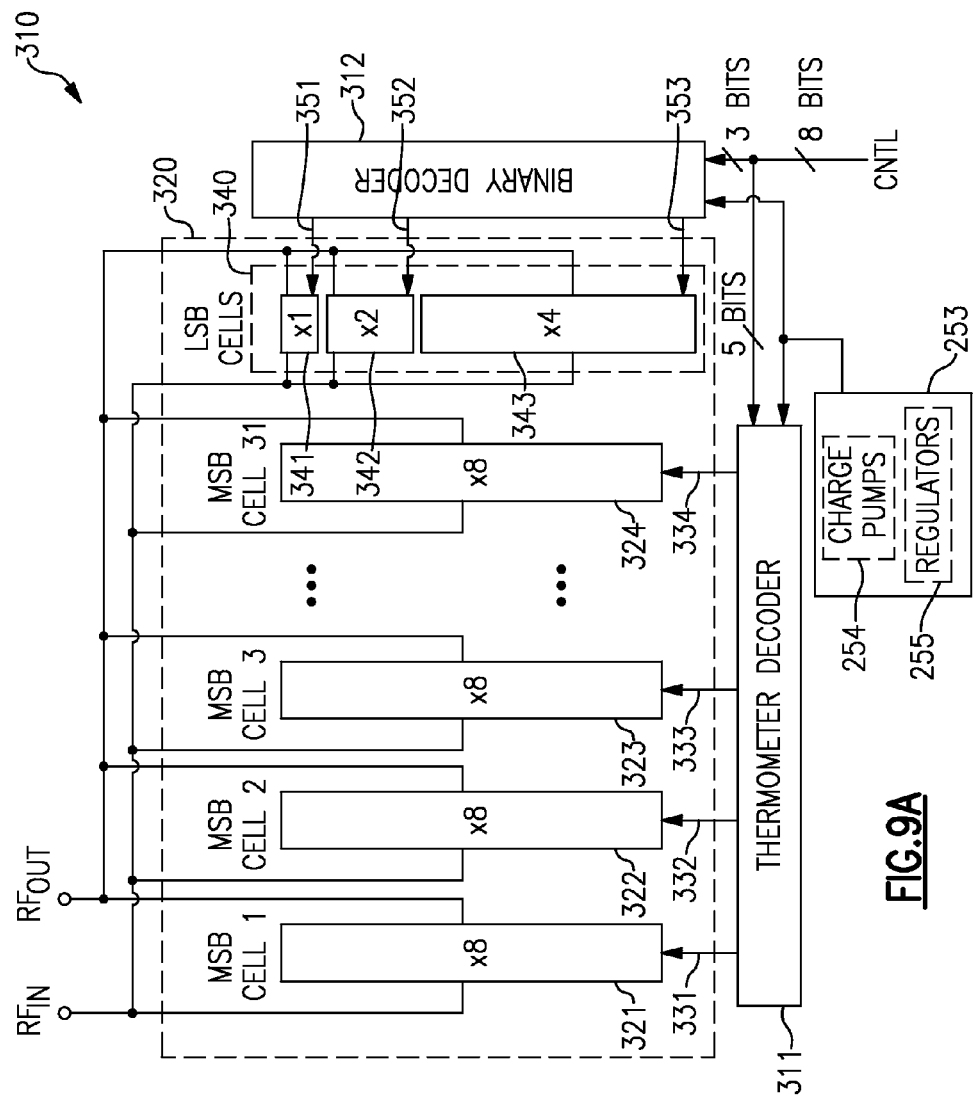
FIG. 9A is a schematic diagram of a segmented variable capacitor array according to another embodiment.

FIG. 9A is a schematic diagram of a segmented variable capacitor array 310 according to another embodiment. The segmented variable capacitor array 310 comprises a 5-bit MSB thermometer decoder 311, a 3-bit LSB binary decoder 312, analog circuitry 253, and an array of variable capacitor cells 320. The segmented variable capacitor array 310 includes an RF input $RF_{IN}$ and an RF output $RF_{OUT}$, and receives a multi-bit digital control signal CNTL carrying 8 bits.

The array of variable capacitor cells 320 includes thirty-one MSB cells including a first MSB cell 321, a second MSB cell 322, a third MSB cell 323, and a thirty-first MSB cell 324. For clarity of the figures, the fourth to thirtieth MSB cells are represented using ellipses in FIG. 9A. Each of the MSB cells has about 8 times a unit capacitance. Additionally, each of the MSB cells is electrically connected in parallel between the RF input $RF_{IN}$ and the RF output $RF_{OUT}$. As shown in FIG. 9A, the 5-bit MSB thermometer decoder 311 generates MSB control signals for controlling the capacitance of the MSB cells, including a first MSB control signal 331, a second MSB control signal 332, a third MSB control signal 333, and a thirty-first MSB control signal 334. For clarity of the figures, the fourth to thirtieth MSB control signals are represented using ellipses in FIG. 9A.

The array of variable capacitor cells 320 includes three LSB cells including a first LSB cell 341, a second LSB cell 342, and a third LSB cell 343. Each of the LSB cells 341-343 is electrically connected in parallel between the RF input $RF_{IN}$ and the RF output $RF_{OUT}$. The LSB cells 341-343 are binary-weighted, with the first LSB cell 341 having about 1 times the unit capacitance, the second LSB cell 342 having about 2 times the unit capacitance, and the third LSB cell 343 having about 4 times the unit capacitance. As shown in FIG. 9A, the 3-bit LSB binary decoder 312 generates LSB control signals for controlling the capacitance of the LSB cells 341-343. In particular, the 3-bit LSB binary decoder 312 generates a first LSB control signal 351 for controlling the first LSB cell 341, a second LSB control signal 352 for controlling the second LSB cell 342, and a third LSB control signal 353 for controlling the third LSB cell 343.

Additional details of the segmented variable capacitor array 310 can be similar to those described earlier.

Figure 9B:
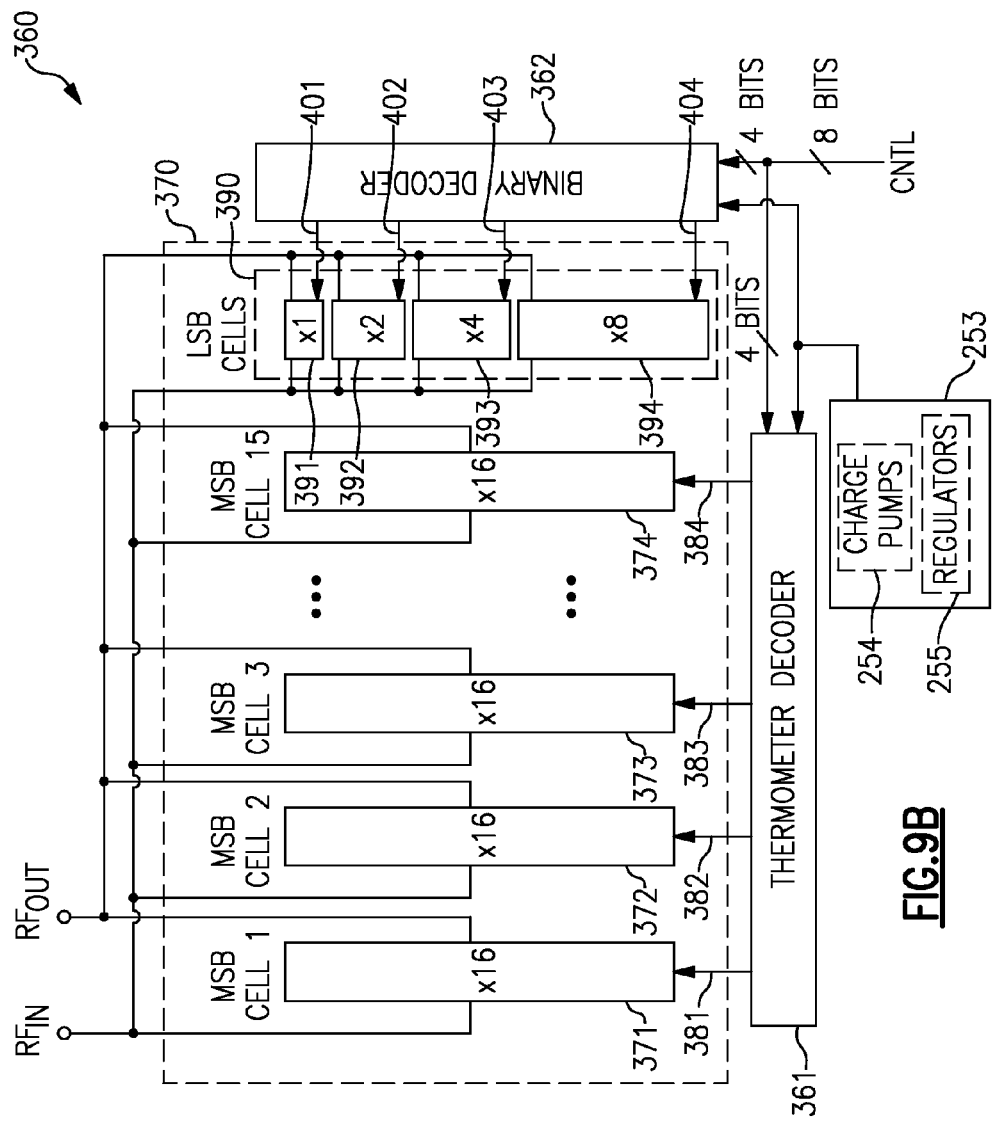
FIG. 9B is a schematic diagram of a segmented variable capacitor array according to another embodiment.

FIG. 9B is a schematic diagram of a segmented variable capacitor array 360 according to another embodiment. The segmented variable capacitor array 360 comprises a 4-bit MSB thermometer decoder 361, a 4-bit LSB binary decoder 362, analog circuitry 253, and an array of variable capacitor cells 370. The segmented variable capacitor array 360 includes an RF input $RF_{IN}$ and an RF output $RF_{OUT}$, and receives a multi-bit digital control signal CNTL carrying 8 bits.

The array of variable capacitor cells 370 includes fifteen MSB cells including a first MSB cell 371, a second MSB cell 372, a third MSB cell 373, and a fifteenth MSB cell 374. For clarity of the figures, the fourth to fourteenth MSB cells are represented using ellipses in FIG. 9B. Each of the MSB cells has about 16 times a unit capacitance. Additionally, each of the MSB cells is electrically connected in parallel between the RF input $RF_{IN}$ and the RF output $RF_{OUT}$. As shown in FIG. 9B, the 4-bit MSB thermometer decoder 361 generates MSB control signals for controlling the capacitance of the MSB cells, including a first MSB control signal 381, a second MSB control signal 382, a third MSB control signal 383, and a fifteenth MSB control signal 384. For clarity of the figures, the fourth to fourteenth MSB control signals are represented using ellipses in FIG. 9B.

The array of variable capacitor cells 370 includes four LSB cells including a first LSB cell 391, a second LSB cell 392, a third LSB cell 393, and a fourth LSB cell 394. Each of the LSB cells 391-394 is electrically connected in parallel between the RF input $RF_{IN}$ and the RF output $RF_{OUT}$. The LSB cells 391-394 are binary-weighted, with the first LSB cell 391 having about 1 times the unit capacitance, the second LSB cell 392 having about 2 times the unit capacitance, the third LSB cell 393 having about 4 times the unit capacitance, and the fourth LSB cell 394 having about 8 times the unit capacitance. As shown in FIG. 9B, the 4-bit LSB binary decoder 362 generates LSB control signals for controlling the capacitance of the LSB cells 391-394. In particular, the 4-bit LSB binary decoder 362 generates a first LSB control signal 401 for controlling the first LSB cell 391, a second LSB control signal 402 for controlling the second LSB cell 392, a third LSB control signal 403 for controlling the third LSB cell 393, and a fourth LSB control signal 404 for controlling the fourth LSB cell 394.

Additional details of the segmented variable capacitor array 360 can be similar to those described earlier.

Figure 9C:
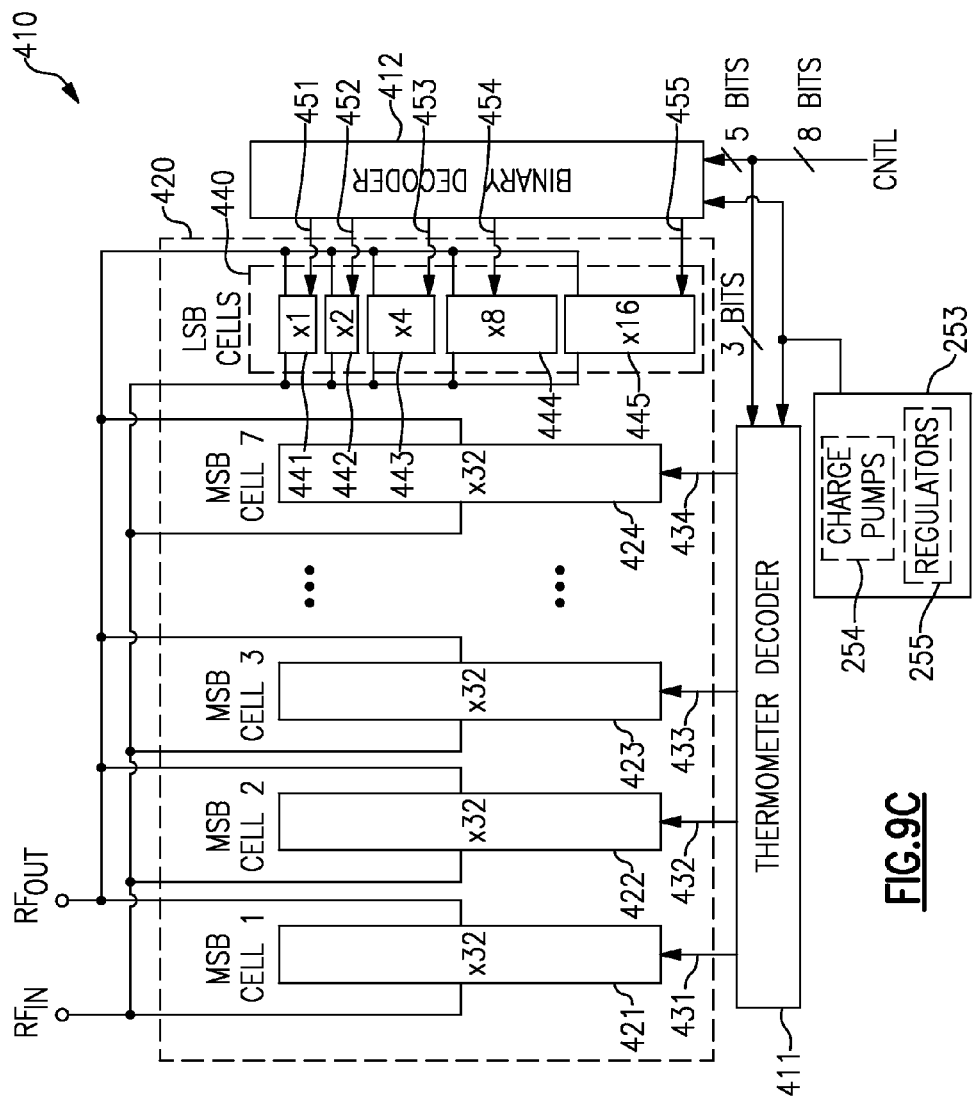
FIG. 9C is a schematic diagram of a segmented variable capacitor array according to another embodiment.

FIG. 9C is a schematic diagram of a segmented variable capacitor array 410 according to another embodiment. The segmented variable capacitor array 410 comprises a 3-bit MSB thermometer decoder 411, a 5-bit LSB binary decoder 412, analog circuitry 253, and an array of variable capacitor cells 420. The segmented variable capacitor array 410 includes an RF input $RF_{IN}$ and an RF output $RF_{OUT}$, and receives a multi-bit digital control signal CNTL carrying 8 bits.

The array of variable capacitor cells 420 includes seven MSB cells including a first MSB cell 421, a second MSB cell 422, a third MSB cell 423, and a seventh MSB cell 424. For clarity of the figures, the fourth to sixth MSB cells are represented using ellipses in FIG. 9C. Each of the MSB cells has about 32 times a unit capacitance. Additionally, each of the MSB cells is electrically connected in parallel between the RF input $RF_{IN}$ and the RF output $RF_{OUT}$. As shown in FIG. 9C, the 3-bit MSB thermometer decoder 411 generates MSB control signals for controlling the capacitance of the MSB cells, including a first MSB control signal 431, a second MSB control signal 432, a third MSB control signal 433, and a seventh MSB control signal 434. For clarity of the figures, the fourth to sixth MSB control signals are represented using ellipses in FIG. 9C.

The array of variable capacitor cells 420 includes five LSB cells including a first LSB cell 441, a second LSB cell 442, a third LSB cell 443, a fourth LSB cell 444, and a fifth LSB cell 445. Each of the LSB cells 441-445 is electrically connected in parallel between the RF input $RF_{IN}$ and the RF output $RF_{OUT}$. The LSB cells 441-445 are binary-weighted, with the first LSB cell 441 having about 1 times the unit capacitance, the second LSB cell 442 having about 2 times the unit capacitance, the third LSB cell 443 having about 4 times the unit capacitance, the fourth LSB cell 444 having about 8 times the unit capacitance, and the fifth LSB cell 445 having about 16 times the unit capacitance. As shown in FIG. 9C, the 5-bit LSB binary decoder 412 generates LSB control signals for controlling the capacitance of the LSB cells 441-445. In particular, the 5-bit LSB binary decoder 412 generates a first LSB control signal 451 for controlling the first LSB cell 441, a second LSB control signal 452 for controlling the second LSB cell 442, a third LSB control signal 453 for controlling the third LSB cell 443, a fourth LSB control signal 454 for controlling the fourth LSB cell 444, and a fifth LSB control signal 455 for controlling the fifth LSB cell 445.

Additional details of the segmented variable capacitor array 410 can be similar to those described earlier.

Figure 10:
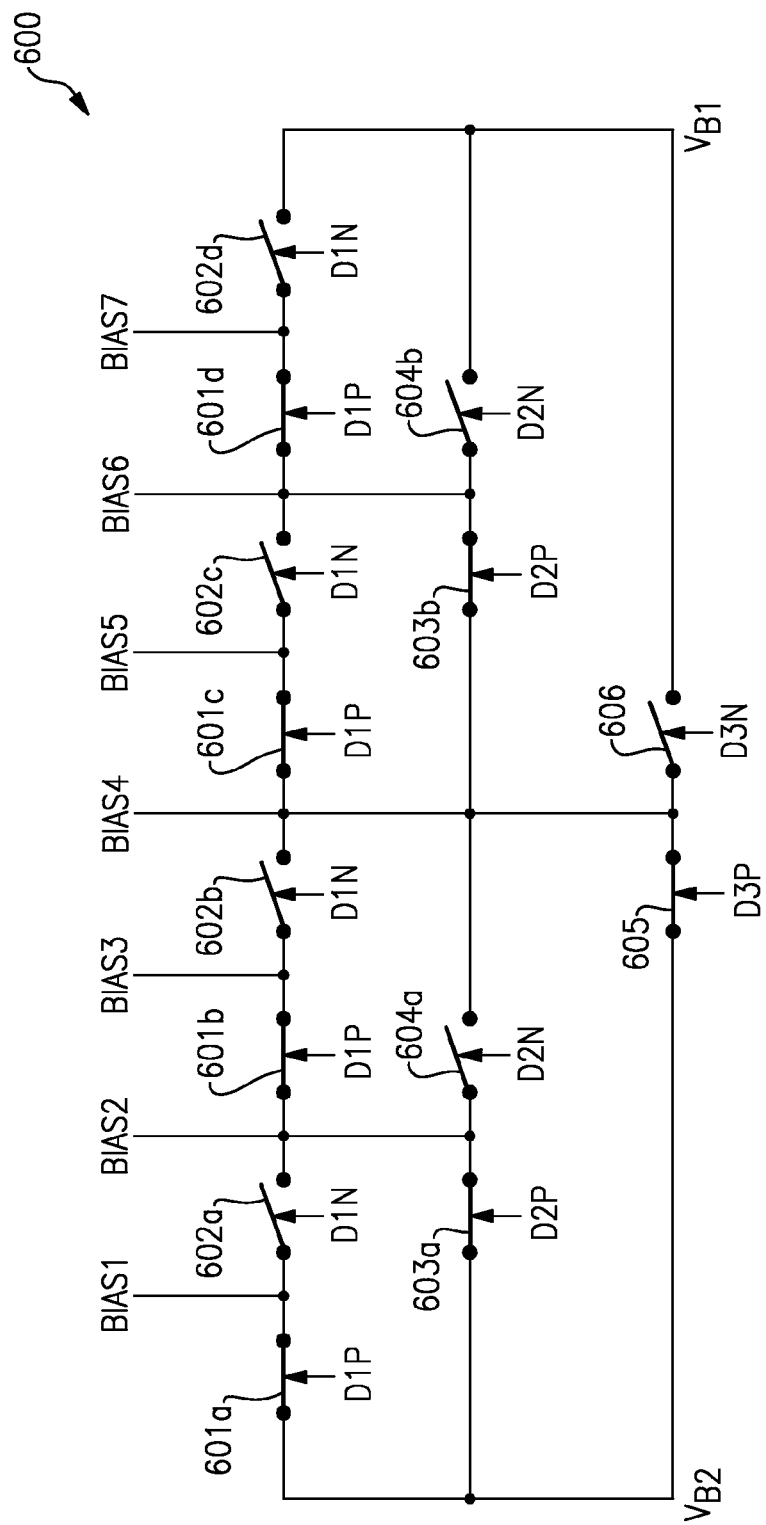
FIG. 10 is a circuit diagram of a thermometer decoder according to one embodiment.

FIG. 10 is a circuit diagram of a thermometer decoder 600 according to one embodiment. Thermometer decoder 600 operates using three control bits, and generates seven bias or control signals. The thermometer decoder 600 illustrates one embodiment of the 3-bit MSB thermometer decoder 411 of FIG. 9C.

The thermometer decoder 600 includes a first group of switches 601a-601d including a first switch 601a, a second switch 601b, a third switch 601c, and a fourth switch 601d. The first group of switches 601a-601d receives a non-inverted version of the first control bit (D1P), and are turned on or closed when the first control bit is logically high and turned off or opened when the first control bit is logically low. The thermometer decoder 600 further includes a second group of switches 602a-602d including a fifth switch 602a, a sixth switch 602b, a seventh switch 602c, and an eighth switch 602d. The second group of switches 602a-602d receives an inverted version of the first control bit (D1N), and are closed when the first control bit is logically low and opened when the first control bit is logically high.

The thermometer decoder 600 further includes a third group of switches 603a-603b including a ninth switch 603a and a tenth switch 603b. The third group of switches 603a-603b receives a non-inverted version of the second control bit (D2P), and are closed when the second control bit is logically high and opened when the second control bit is logically low. The thermometer decoder 600 further includes a fourth group of switches 604a-604b including an eleventh switch 604a and a twelfth switch 604b. The fourth group of switches 604a-604b receives an inverted version of the second control bit (D2N), and are closed when the second control bit is logically low and opened when the second control bit is logically high. The thermometer decoder 600 further includes a thirteenth switch 605 that receives a non-inverted version of the third control bit (D3P), and that is closed when the third control bit is logically high and opened when the third control bit is logically low. The thermometer decoder 600 further includes a fourteenth switch 606 that receives an inverted version of the third control bit (D3N), and that is closed when the third control bit is logically low and opened when the third control bit is logically high.

The illustrated switches are used to selectively control each of seven control or bias signals to either a first bias voltage level $V_{B1}$ or to a second bias voltage level $V_{B2}$. Table 1 below illustrates the voltage levels of the seven control signals based on a state of the first control signal (D1), the second control signal (D2), and the third control signal (D3). As shown in Table 1, the control signals activate in accordance with a thermometer coding scheme.

TABLE 1

| D3 | D2 | D1 | BIAS1 | BIAS2 | BIAS3 | BIAS4 | BIAS5 | BIAS6 | BIAS7 |
|----|----|----|-------|-------|-------|-------|-------|-------|-------|
| 0 | 0 | 0 | $V_{B1}$ | $V_{B1}$ | $V_{B1}$ | $V_{B1}$ | $V_{B1}$ | $V_{B1}$ | $V_{B1}$ |
| 0 | 0 | 1 | $V_{B2}$ | $V_{B1}$ | $V_{B1}$ | $V_{B1}$ | $V_{B1}$ | $V_{B1}$ | $V_{B1}$ |
| 0 | 1 | 0 | $V_{B2}$ | $V_{B2}$ | $V_{B1}$ | $V_{B1}$ | $V_{B1}$ | $V_{B1}$ | $V_{B1}$ |
| 0 | 1 | 1 | $V_{B2}$ | $V_{B2}$ | $V_{B2}$ | $V_{B1}$ | $V_{B1}$ | $V_{B1}$ | $V_{B1}$ |

TABLE 1-continued

| D3 | D2 | D1 | BIAS1 | BIAS2 | BIAS3 | BIAS4 | BIAS5 | BIAS6 | BIAS7 |
|---|---|---|---|---|---|---|---|---|---|
| 1 | 0 | 0 | $V_{B2}$ | $V_{B2}$ | $V_{B2}$ | $V_{B2}$ | $V_{B1}$ | $V_{B1}$ | $V_{B1}$ |
| 1 | 0 | 1 | $V_{B2}$ | $V_{B2}$ | $V_{B2}$ | $V_{B2}$ | $V_{B2}$ | $V_{B1}$ | $V_{B1}$ |
| 1 | 1 | 0 | $V_{B2}$ | $V_{B2}$ | $V_{B2}$ | $V_{B2}$ | $V_{B2}$ | $V_{B2}$ | $V_{B1}$ |
| 1 | 1 | 1 | $V_{B2}$ | $V_{B2}$ | $V_{B2}$ | $V_{B2}$ | $V_{B2}$ | $V_{B2}$ | $V_{B2}$ |

In one embodiment, at least one of the first bias voltage level $V_{B1}$ or the first bias voltage level $V_{B2}$ is generated by analog circuitry, such as charge pumps and/or regulators.

Although the thermometer decoder 600 operates using 3-bits, persons having ordinary skill in the art will appreciate that the illustrated thermometer decoder can be modified to include more or fewer switches to operate using control signals carrying a different number of bits.

Figure 11:
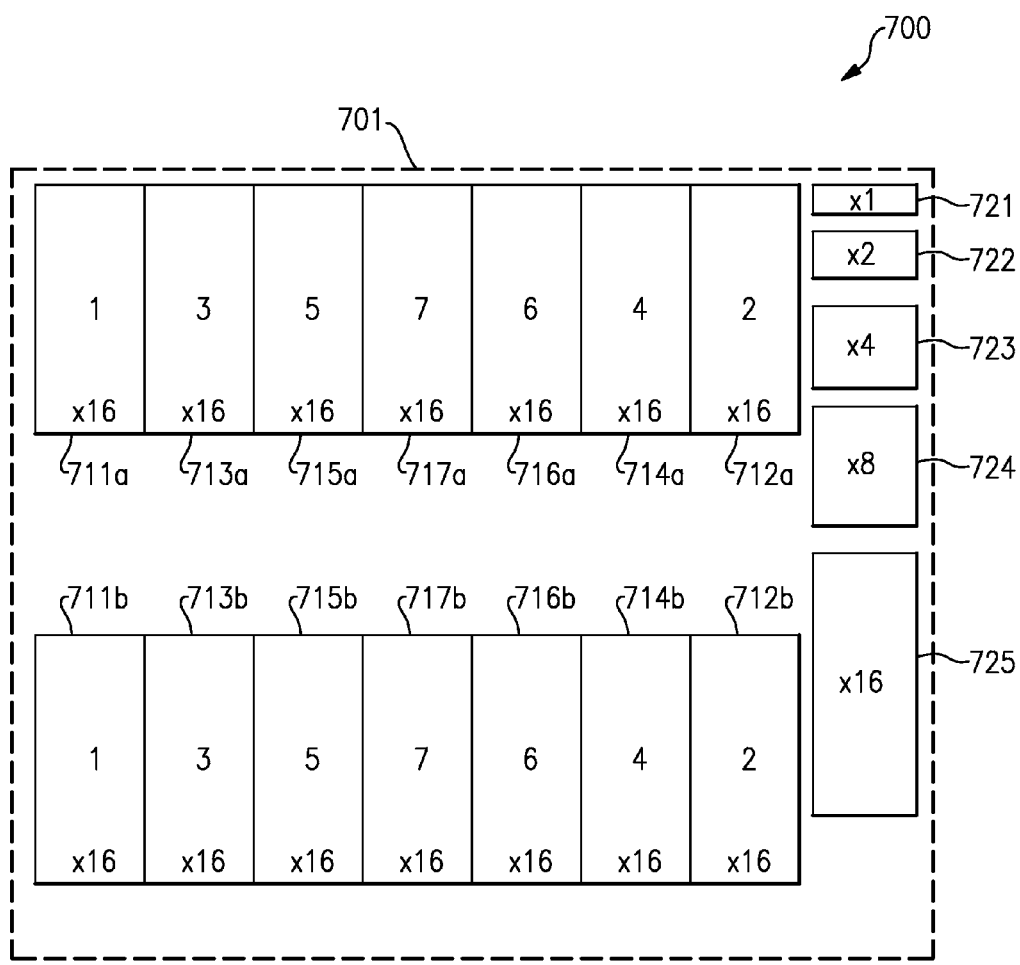
FIG. 11 is a plan view of a centroided segmented variable capacitor array layout according to one embodiment.

FIG. 11 is a plan view of a centroided segmented variable capacitor array layout 700 according to one embodiment. The layout 700 illustrates a plan view of one embodiment of the layout of the array of variable capacitor cells 420 of FIG. 9C. However, the array of variable capacitor cells 420 of FIG. 9C can be implemented with a different layout.

The layout 700 includes a first group of sixteen unit capacitance cells 711a and a second group of sixteen unit capacitance cells 711b, which can be controlled or biased using a first MSB control signal. Additionally, the layout 700 includes a third group of sixteen unit capacitance cells 712a and a fourth group of sixteen unit capacitance cells 712b, which can be controlled using a second MSB control signal. Furthermore, the layout 700 includes a fifth group of sixteen unit capacitance cells 713a and a sixth group of sixteen unit capacitance cells 713b, which can be controlled using a third MSB control signal. Additionally, the layout 700 includes a seventh group of sixteen unit capacitance cells 714a and an eighth group of sixteen unit capacitance cells 714b, which can be controlled using a fourth MSB control signal. Furthermore, the layout 700 includes a ninth group of sixteen unit capacitance cells 715a and a tenth group of sixteen unit capacitance cells 715b, which can be controlled using a fifth MSB control signal. Additionally, the layout 700 includes an eleventh group of sixteen unit capacitance cells 716a and a twelfth group of sixteen unit capacitance cells 716b, which can be controlled using a sixth MSB control signal. Furthermore, the layout 700 includes a thirteenth group of sixteen unit capacitance cells 717a and a fourteenth group of sixteen unit capacitance cells 717b, which can be controlled using a seventh MSB control signal.

With continuing reference to FIG. 11, the layout 700 includes a unit capacitance cell 721, which can be controlled or biased using a first LSB control signal. Additionally, the layout 700 includes a group of two unit capacitance cells 722, which can be controlled using a second LSB control signal. Furthermore, the layout 700 includes a group of four unit capacitance cells 723, which can be controlled using a third LSB control signal. Additionally, the layout 700 includes a group of eight unit capacitance cells 724, which can be controlled using a fourth LSB control signal. Furthermore, the layout 700 includes a group of sixteen unit capacitance cells 725, which can be controlled using a fifth LSB control signal.

The illustrated layout 700 is centroided to reduce an impact of process variation on a capacitance value of the array at a particular setting. For example, processing variation, which can impact the capacitance of a nominally unit capacitance cell, can occur along gradients of a fabricated IC or die. The gradients can include horizontal and/or vertical components. The illustrated centroided layout 700 can aid in reducing capacitance errors associated with processing variation by positioning MSB cells in particular locations to balance horizontal and/or vertical components of procession variation gradients.

For example, in the illustrated configuration, each of the first to seventh MSB control signals is used to control groups of sixteen unit capacitance cells that are spread out in a vertical direction. Thus, if a processing variation is present in the vertical direction, a particular MSB control signal can activate both a group of sixteen unit capacitance cells in the top-half of the layout 700 and a group of sixteen unit capacitance cells in the bottom-half of the layout 700. Thus, when processing variation results in the groups of sixteen unit capacitance cells in the top-half of the layout (for example, 711a, 712a, 713a, 714a, 715a, 716a, 717a) having a slightly higher capacitance than the groups of sixteen unit capacitance cells in the bottom-half of the layout (for example, 711b, 712b, 713b, 714b, 715b, 716b, 717b), a particular MSB control signal will select a group of sixteen unit capacitance cells from each of the top-half and bottom-half of the layout 700. Thus, capacitance errors associated with processing variation gradients in the vertical direction can tend to balance or average.

Additionally, in the illustrated configuration, the sequence that the MSB control signals activate is spread out in a horizontal direction, which can aid in compensating for procession variation gradients that occur in the horizontal direction. For example, with reference back to FIG. 9C, the MSB control signals can be generated using an MSB thermometer decoder, and thus the first to seventh MSB control signals activate in accordance with a thermometer coding scheme. Thus, the MSB cells will activate in an order that balances out horizontal processing variation gradients when the array's control signal is sequentially incremented from a minimum value to a maximum value. For example, when the array's control signal is sequentially incremented in this manner, the seven pairs of groups of sixteen unit capacitance cells can activate in the following sequence: (1) first and second groups 711a, 711b; (2) third and fourth groups 712a, 712b; (3) fifth and sixth groups 713a, 713b; (4) seventh and eighth groups 714a, 714b; (5) ninth and tenth groups 715a, 715b; (6) eleventh and twelfth groups 716a, 716b; and (7) thirteenth and fourteenth groups 717a, 717b. As skilled artisans will appreciate, capacitance errors associated with processing variation gradients in the horizontal direction can tend to balance or average since the order that the groups of sixteen unit capacitance cells activate is spread out in the horizontal direction.

By implementing a segmented variation capacitor array with a centroided layout, the segmented variable capacitor array can exhibit enhanced performance, including, for example, higher linearity and/or enhanced robustness to processing variation.

In one embodiment, an MSB thermometer decoder extends in the horizontal direction of FIG. 11, and is positioned between the groups of sixteen unit capacitance cells in the top-half of the layout and the groups of sixteen unit capacitance cells in the bottom-half of the layout. Configuring the MSB thermometer decoder in this manner can reduce a maximum length of the MSB control signals relative to a configuration in which the MSB thermometer decoder is positioned along an edge of the array.

Although one embodiment of a centroided layout for the array of variable capacitor cells 420 of FIG. 9C has been shown, any of the segmented variable capacitor arrays described herein can be implemented with a centroided layout. Furthermore, other implementations of centroided layouts can be used in accordance with the teachings herein.

Figure 12A:
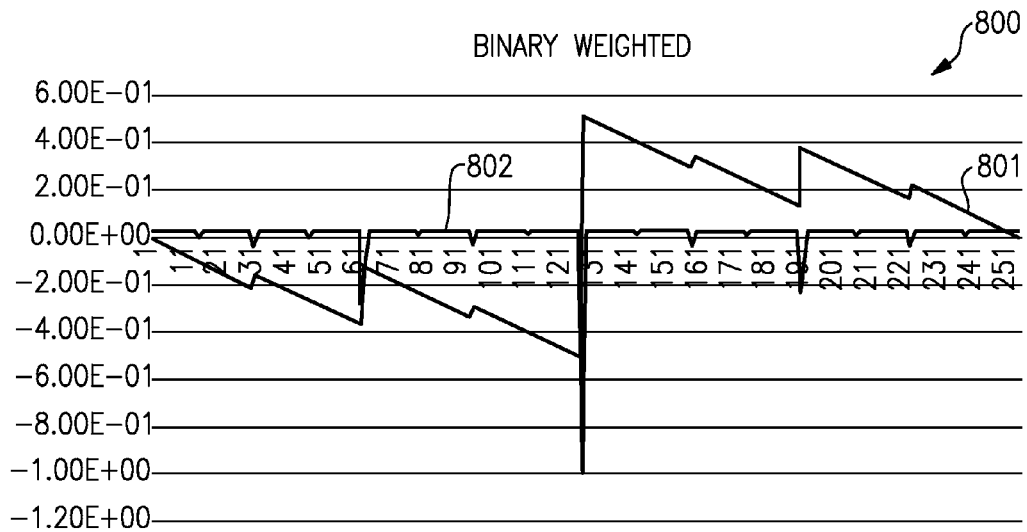
FIG. 12A is a graph of integral and differential linearity for one example of a binary-weighted variable capacitor array.

FIG. 12A is a graph 800 of integral and differential linearity for one example of a binary-weighted variable capacitor array. The graph 800 includes a first plot 801 of integral linearity and a second plot 802 of differential linearity.

The graph 200 corresponds to a simulation of an 8-bit binary-weighted array. As shown by the first and second plots 801, 802, the binary-weighted array can exhibit relatively poor integral and differential linearity, particularly at the transition from the control code value 01111111 to the control code value 10000000.

Figure 12B:
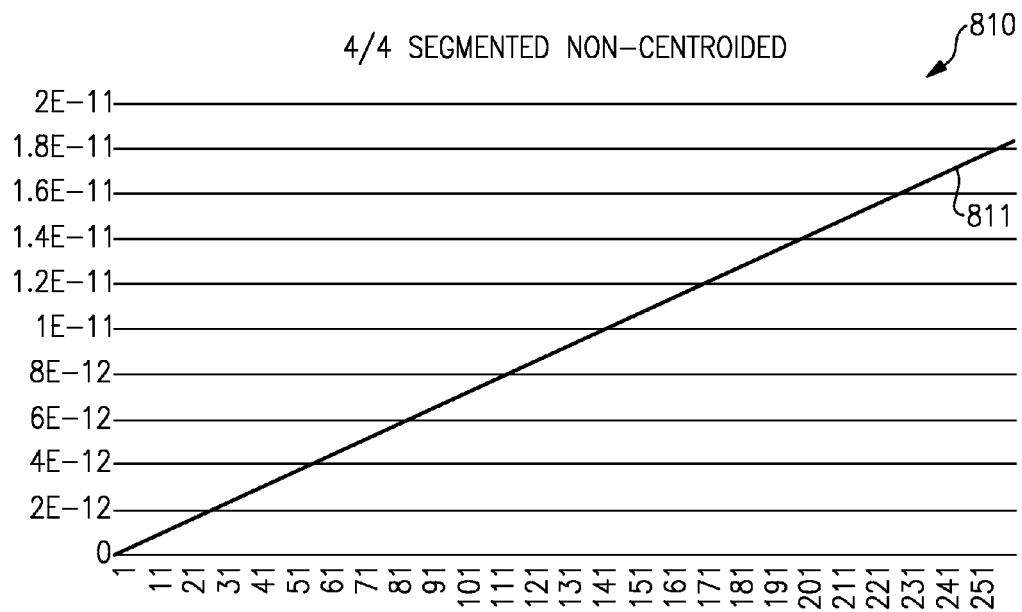
FIG. 12B is a graph of capacitance versus control code for one example of a non-centroided segmented variable capacitor array.

FIG. 12B is a graph 810 of capacitance versus control code for one example of a non-centroided segmented variable capacitor array. The graph 810 includes a plot 811 of simulated capacitance versus control code for an 8-bit segmented variable capacitor array implemented using a 4-bit MSB thermometer decoder and a 4-bit LSB binary decoder. As shown by the plot 811, the segmented variable capacitor array's capacitance monotonically increases with control code.

Figure 12C:
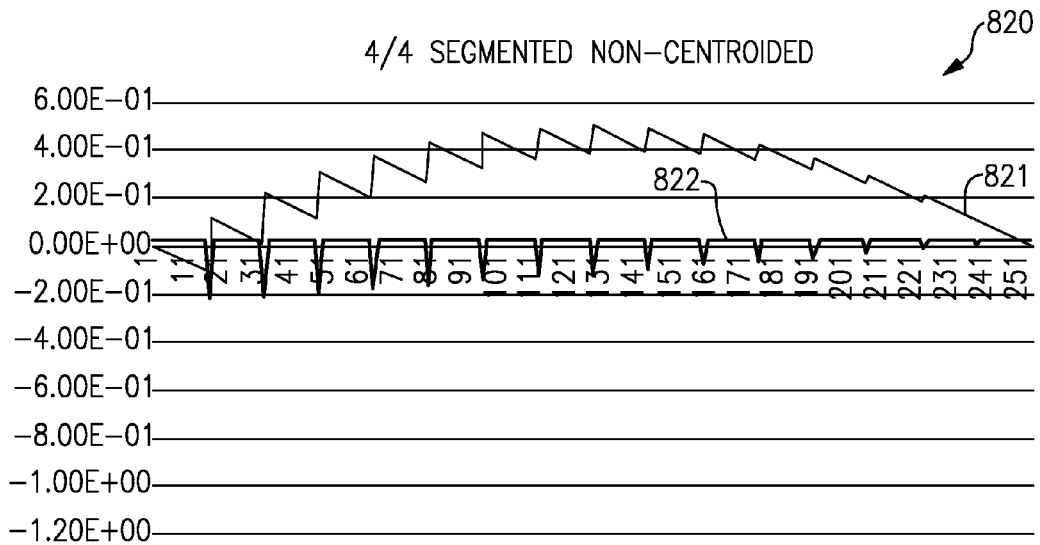
FIG. 12C is a graph of integral and differential linearity for one example of a non-centroided segmented variable capacitor array.

FIG. 12C is a graph 820 of integral and differential linearity for one example of a non-centroided segmented variable capacitor array. The graph 820 includes a first plot 821 of integral linearity and a second plot 822 of differential linearity. The graph 820 includes simulated results of an 8-bit non-centroided segmented variable capacitor array implemented using a 4-bit MSB thermometer decoder and a 4-bit LSB binary decoder. As shown by a comparison of the first plot 821 of FIG. 12C to the first plot 801 of FIG. 12A and by a comparison of the second plot 822 of FIG. 12C to the second plot 802 of FIG. 12A, the segmented variable capacitor array exhibits superior integral and differential linearity relative to the binary-weighted array, even when implemented without a centroided layout.

Figure 12D:
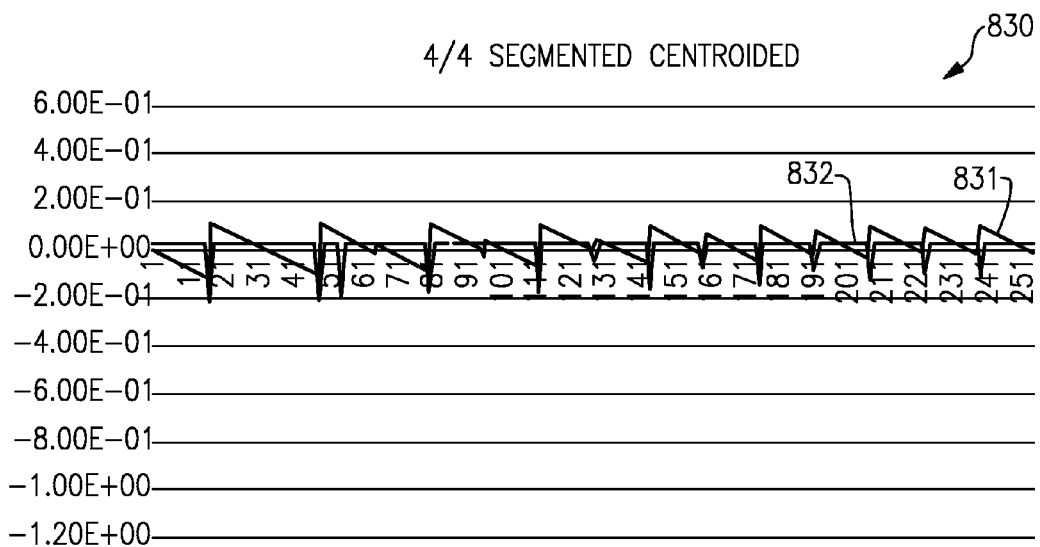
FIG. 12D is a graph of integral and differential linearity for one example of a centroided segmented variable capacitor array.

FIG. 12D is a graph 830 of integral and differential linearity for one example of a centroided segmented variable capacitor array. The graph 830 includes a first plot 831 of integral linearity and a second plot 832 of differential linearity. The graph 830 includes simulated results of an 8-bit centroided segmented variable capacitor array implemented using a 4-bit MSB thermometer decoder and a 4-bit LSB binary decoder. As shown by a comparison of the first plot 831 of FIG. 12D to the first plot 821 of FIG. 12C and by a comparison of the second plot 832 of FIG. 12D to the second plot 822 of FIG. 12C, the centroided segmented variable capacitor array exhibits superior integral linearity relative to the non-centroided segmented variable capacitor array.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not only the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An integrated circuit comprising:
   a segmented variable capacitor array configured to receive a multi-bit digital control signal, wherein the segmented variable capacitor array comprises:
   a radio frequency (RF) input and an RF output;
   a plurality of most significant bit (MSB) variable capacitor cells electrically connected in parallel between the RF input and the RF output, wherein the plurality of MSB variable capacitor cells comprises a plurality of pairs of metal oxide semiconductor (MOS) capacitors, wherein the plurality of pairs of MOS capacitors comprises at least one pair of MOS capacitors electrically connected between the RF input and the RF output in a signal path that omits any switches;

a plurality of least significant bit (LSB) variable capacitor cells electrically connected in parallel between the RF input and the RF output, wherein each of the plurality of MSB variable capacitor cells has a nominal capacitance that is greater than a nominal capacitance of each of the plurality of LSB variable capacitor cells;

an MSB decoder configured to receive a first portion of bits of the multi-bit digital control signal and to generate a plurality of MSB control signals, wherein the plurality of MSB control signals are configured to control a capacitance of the plurality of MSB variable capacitor cells; and an LSB decoder configured to receive a second portion of bits of the multi-bit digital control signal and to generate a plurality of LSB control signals, wherein the plurality of LSB control signals are configured to control a capacitance of the plurality of LSB variable capacitor cells.

2. The integrated circuit of claim 1, wherein the plurality of MSB variable capacitor cells have about the same nominal capacitance as one another.

3. The integrated circuit of claim 2, wherein the MSB decoder comprises a thermometer decoder.

4. The integrated circuit of claim 2, wherein the plurality of LSB variable capacitor cells have a different nominal capacitance from one another.

5. The integrated circuit of claim 4, wherein the plurality of LSB variable capacitor cells are binary-weighted, wherein the LSB decoder comprises a binary decoder.

6. The integrated circuit of claim 1, further comprising an array of metal oxide semiconductor (MOS) variable capacitor cells, wherein the array of MOS variable capacitor cells comprises the plurality of MSB variable capacitor cells and the plurality of LSB variable capacitor cells.

7. The integrated circuit of claim 1, wherein the at least one pair of MOS capacitors comprises a first pair of MOS capacitors electrically connected in anti-series.

8. The integrated circuit of claim 1, wherein the at least one pair of MOS capacitors comprises a first pair of MOS capacitors electrically connected in anti-parallel.

9. The integrated circuit of claim 1, wherein the MSB decoder is elongated in a first direction, and wherein the LSB decoder is elongated in a second direction substantially perpendicular to the first direction.

10. The integrated circuit of claim 9, wherein the MSB decoder comprises a thermometer decoder and the LSB decoder comprises a binary decoder.

11. The integrated circuit of claim 1, wherein the plurality of MSB variable capacitor cells are implemented in a layout that is centroided.

12. The integrated circuit of claim 1, wherein the MSB decoder selectively controls each of the plurality of MSB control signals to either a first bias voltage level or a second bias voltage level based on a state of the first portion of bits, and wherein the LSB decoder selectively controls each of the plurality of LSB control signals to either the first bias voltage level or the second bias voltage level based on a state of the second portion of bits.

13. The integrated circuit of claim 12, further comprising analog circuitry configured to generate at least one of the first bias voltage level or the second bias voltage level.

14. The integrated circuit of claim 1, wherein the first portion of bits comprises at least 3 bits, and wherein the second portion of bits comprises at least 3 bits.

15. A method of controlling a variable capacitance between a radio frequency (RF) input and an RF output, the method comprising:

receiving a multi-bit digital control signal;

generating a plurality of most significant bit (MSB) control signals by decoding a first portion of bits of the multi-bit digital control signal using an MSB decoder;

biasing a plurality of MSB variable capacitor cells using the plurality of MSB control signals, wherein each of the plurality of MSB variable capacitor cells is electrically connected in parallel between the RF input and the RF output, wherein the plurality of MSB variable capacitor cells comprises a plurality of pairs of metal oxide semiconductor (MOS) capacitors, wherein the plurality of pairs of MOS capacitors comprises at least one pair of MOS capacitors electrically connected between the RF input and the RF output in a signal path that omits any switches;

generating a plurality of least significant bit (LSB) control signals by decoding a second portion of bits of the multi-bit digital control signal using an LSB decoder; and biasing a plurality of LSB variable capacitor cells using the plurality of LSB control signals, wherein each of the plurality of LSB variable capacitor cells is electrically connected in parallel between the RF input and the RF output, wherein each of the plurality of MSB variable capacitor cells has a nominal capacitance that is greater than a nominal capacitance of each of the LSB variable capacitor cells.

16. The method of claim 15, wherein generating the plurality of MSB control signals comprises using a thermometer decoding, and wherein generating the plurality of LSB control signals comprises using a binary decoding.

17. The method of claim 15, wherein biasing the plurality of MSB variable capacitor cells and biasing the plurality of LSB variable capacitor cells comprises biasing an array of metal oxide semiconductor (MOS) variable capacitor cells.

18. The method of claim 17, wherein biasing the array of MOS variable capacitor cells comprises biasing at least one of a pair of MOS capacitors connected in anti-parallel or a pair of MOS capacitors connected in anti-series.

19. An apparatus comprising:

a radio frequency (RF) input;

an RF output;

a first plurality of variable capacitor cells electrically connected in parallel between the RF input and the RF output, wherein each of the first plurality of variable capacitor cells has about the same nominal capacitance as one another, wherein the first plurality of variable capacitor cells comprises a plurality of pairs of metal oxide semiconductor (MOS) capacitors, wherein the plurality of pairs of MOS capacitors comprises at least one pair of MOS capacitors electrically connected between the RF input and the RF output in a signal path that omits any switches; and a thermometer decoder configured to receive a first plurality of control bits and to generate a first plurality of control signals, wherein the first plurality of control signals are configured to control a capacitance of the first plurality of variable capacitor cells.

20. The apparatus of claim 19, wherein the first plurality of variable capacitor cells are implemented in a layout that is centroided.

21. The apparatus of claim 19, wherein the at least one pair of MOS capacitors comprises a first pair of MOS capacitors electrically connected in anti-series.

22. The apparatus of claim 19, wherein the at least one pair of MOS capacitors comprises a first pair of MOS capacitors electrically connected in anti-parallel.

23. The apparatus of claim 19, further comprising:
a second plurality of variable capacitor cells electrically connected in parallel between the RF input and the RF output, wherein each of the first plurality of variable capacitor cells has a nominal capacitance that is greater than a nominal capacitance of each of the second plurality of variable capacitor cells.

24. The apparatus of claim 23, wherein the second plurality of variable capacitor cells have a different nominal capacitance from one another.

25. The apparatus of claim 24, wherein the second plurality of variable capacitor cells are binary-weighted, wherein the apparatus further comprises a binary decoder configured to receive a second plurality of control bits and to generate a second plurality of control signals, wherein the second plurality of control signals are configured to control a capacitance of the second plurality of variable capacitor cells.

* * * * *